(12) United States Patent
Toshikiyo

(10) Patent No.: US 8,018,508 B2
(45) Date of Patent: *Sep. 13, 2011

(54) LIGHT-COLLECTING DEVICE AND SOLID-STATE IMAGING APPARATUS

(75) Inventor: Kimiaki Toshikiyo, Osaka (JP)

(73) Assignee: PANASONIC Corporation, Osaka (JP)

(*) Notice: Subject to any disclaimer, the term of this patent is extended or adjusted under 35 U.S.C. 154(b) by 916 days.

This patent is subject to a terminal disclaimer.

(21) Appl. No.: 10/576,023

(22) PCT Filed: Dec. 15, 2004

(86) PCT No.: PCT/JP2004/018746
§ 371 (c)(1),
(2), (4) Date: Apr. 17, 2006

(87) PCT Pub. No.: WO2005/101067
PCT Pub. Date: Oct. 27, 2005

(65) Prior Publication Data
US 2007/0146531 A1    Jun. 28, 2007

(30) Foreign Application Priority Data
Apr. 13, 2004    (JP) ................... 2004-117689

(51) Int. Cl.
H01L 27/146    (2006.01)
G02B 5/18    (2006.01)

(52) U.S. Cl. ............... 348/272; 250/208.1; 359/566; 359/652

(58) Field of Classification Search ............ 359/575, 359/652–655
See application file for complete search history.

(56) References Cited

U.S. PATENT DOCUMENTS

| | | | | |
|---|---|---|---|---|
| 4,403,827 A * | 9/1983 | Bryan et al. | | 427/166 |
| 4,994,664 A | 2/1991 | Veldkamp | | |
| 5,227,915 A * | 7/1993 | Grossinger et al. | | 359/565 |
| 5,477,383 A * | 12/1995 | Jain | | 359/565 |

(Continued)

FOREIGN PATENT DOCUMENTS

EP    0649037    4/1995

(Continued)

OTHER PUBLICATIONS

English Language Abstract JP 2001-196568, Jul. 19, 2001.

(Continued)

*Primary Examiner* — David Ometz
*Assistant Examiner* — Dwight Alex C Tejano
(74) *Attorney, Agent, or Firm* — Greenblum & Bernstein, P.L.C.

(57) ABSTRACT

The present invention provides an optical device and the like which can collect incident light at a high incident angle than an existing microlens, in order to realize a solid-state imaging apparatus and the like corresponding to an optical system (an optical system with a high incident angle θ) with a short focal length for a thin camera.

Each unit pixel (2.8 μm square in size) is made up of a distributed index lens 1, a color filter 2 for green G, Al wirings 3, a signal transmitting unit 4, planarizing films 5, a light-receiving device (Si photodiodes) 6, and a Si substrate 7. The distributed index lens 1 is made of high refractive index materials 33 [$TiO_2$ (n=2.53)] and low refractive index materials 34 [air (n=1.0)] having concentric zones. Further, in a distributed refractive index lens, a width 35 of adjacent divided areas is 200 nm. Also, a film thickness t is 0.5 μm.

18 Claims, 27 Drawing Sheets

U.S. PATENT DOCUMENTS

| | | | |
|---|---|---|---|
| 5,555,129 A * | 9/1996 | Konno et al. | 359/569 |
| 5,561,558 A | 10/1996 | Shiono et al. | |
| 5,561,683 A * | 10/1996 | Kwon | 372/96 |
| 5,742,433 A | 4/1998 | Shiono et al. | |
| 5,978,139 A * | 11/1999 | Hatakoshi et al. | 359/565 |
| 6,327,086 B1 * | 12/2001 | Unno | 359/565 |
| 6,545,808 B1 * | 4/2003 | Ehbets et al. | 359/566 |
| 7,038,184 B2 * | 5/2006 | Chang | 250/208.1 |
| 7,250,973 B2 | 7/2007 | Dobashi et al. | |
| 7,390,532 B2 * | 6/2008 | Dellwo et al. | 427/162 |
| 2002/0001066 A1 * | 1/2002 | Kobayashi | 353/31 |
| 2002/0135825 A1 * | 9/2002 | Lee et al. | 358/509 |
| 2003/0044729 A1 * | 3/2003 | Huang et al. | 430/321 |
| 2003/0164922 A1 * | 9/2003 | Robins et al. | 349/201 |
| 2003/0168679 A1 | 9/2003 | Nakai et al. | |
| 2003/0179457 A1 | 9/2003 | Dobashi et al. | |
| 2003/0189755 A1 * | 10/2003 | Okuno | 359/569 |
| 2003/0227684 A1 * | 12/2003 | Goto | 359/566 |
| 2003/0231395 A1 * | 12/2003 | Nakai | 359/558 |
| 2004/0042801 A1 * | 3/2004 | Wedding | 398/193 |
| 2005/0195485 A1 * | 9/2005 | Hirai et al. | 359/569 |
| 2006/0102827 A1 | 5/2006 | Kasuga et al. | |
| 2006/0125948 A1 * | 6/2006 | Orita et al. | 348/340 |
| 2007/0091453 A1 * | 4/2007 | Ushiro et al. | 359/652 |

FOREIGN PATENT DOCUMENTS

| | | |
|---|---|---|
| EP | 809124 A2 * | 11/1997 |
| JP | 4-343471 | 11/1992 |
| JP | 5-251673 | 9/1993 |
| JP | 7-113906 | 5/1995 |
| JP | 7-113907 | 5/1995 |
| JP | 2000-039503 | 2/2000 |
| JP | 2001-108812 | 4/2001 |
| JP | 2001-196568 | 7/2001 |
| JP | 2001-318217 | 11/2001 |
| JP | 2002-135796 | 5/2002 |
| JP | 2003-229553 | 8/2003 |
| JP | 2003-243638 | 8/2003 |
| JP | 2004-096358 | 3/2004 |

OTHER PUBLICATIONS

English Language Abstract JP 2000-039503, Feb. 8, 2000.
English Language Abstract JP 5-251673, Sep. 28, 1993.
D. W. Prather, "Design and application of subwavelength diffractive lenses for integration with infrared photodetectors," Opt. Eng. 38(5), pp. 870-878 (May 1999; Society of Photo-Optical Instrumentation Engineers).
U.S. Appl. No. 10/576,273, filed Apr. 18, 2006, pub: Jul. 19, 2007.
English Language Abstract of JP 2001-108812, Apr. 20, 2001.
English Language Abstract of JP 2001-318217, Nov. 16, 2001.
English Language Abstract of JP 2002-135796, May, 10, 2002.
English Language Abstract of JP 4-343471, Nov. 30, 1992.
Donald C. O'Shea et al., "Diffractive Optics Design, Fabrication, and Test", SPIE PRESS, pp. 54-56, Dec. 29, 2003.
Toshikiyo et al., "A MOS Image Sensor with Microlenses Built by Sub-Wavelength Patterning", 2007 IEEE ISSCC session 28.8 K, Feb. 14, 2007.
Japan Office action, mail date is Mar. 22, 2011.
Response to an Office Action to the corresponding Chinese patent application No. 200480042730.2 (with a partial English translation of relevant portion).

* cited by examiner

PRIOR ART

PRIOR ART

=

+

Phase modulation

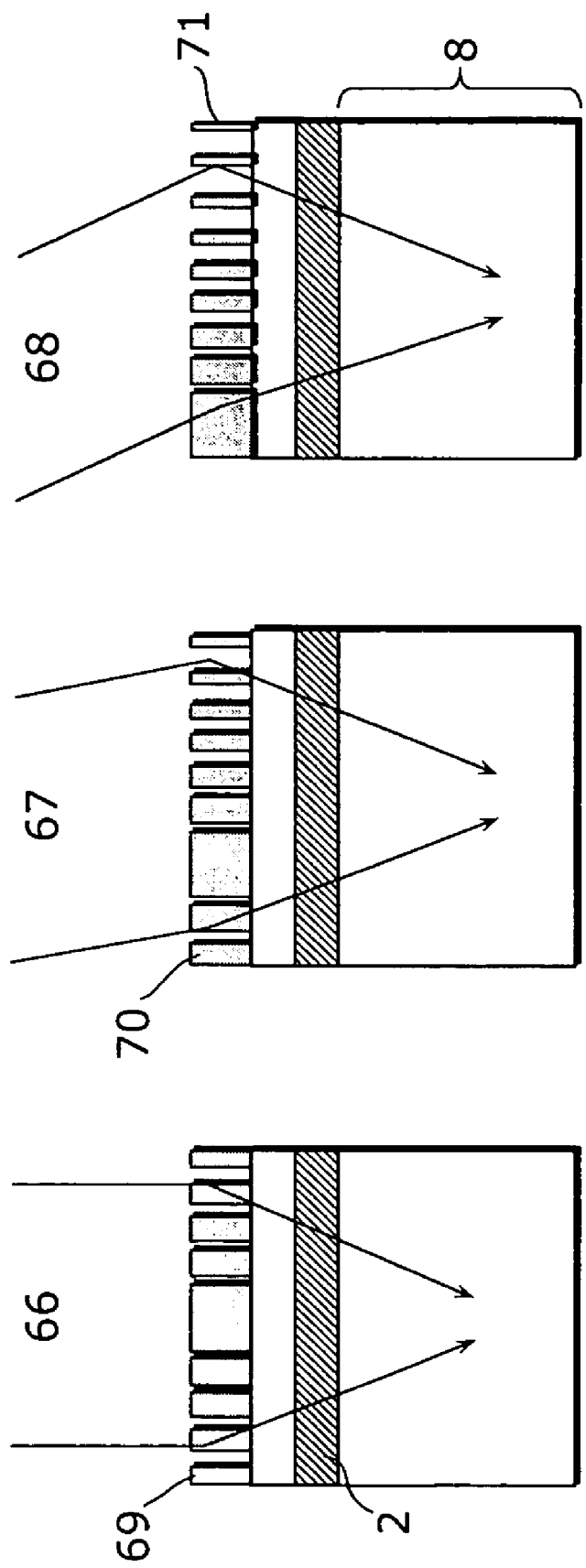

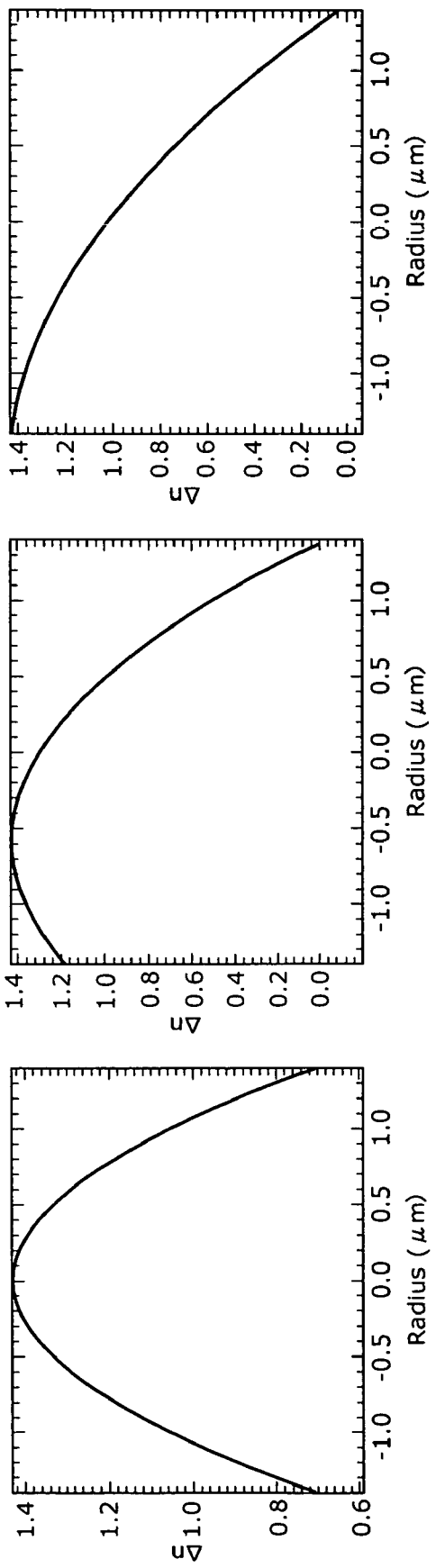

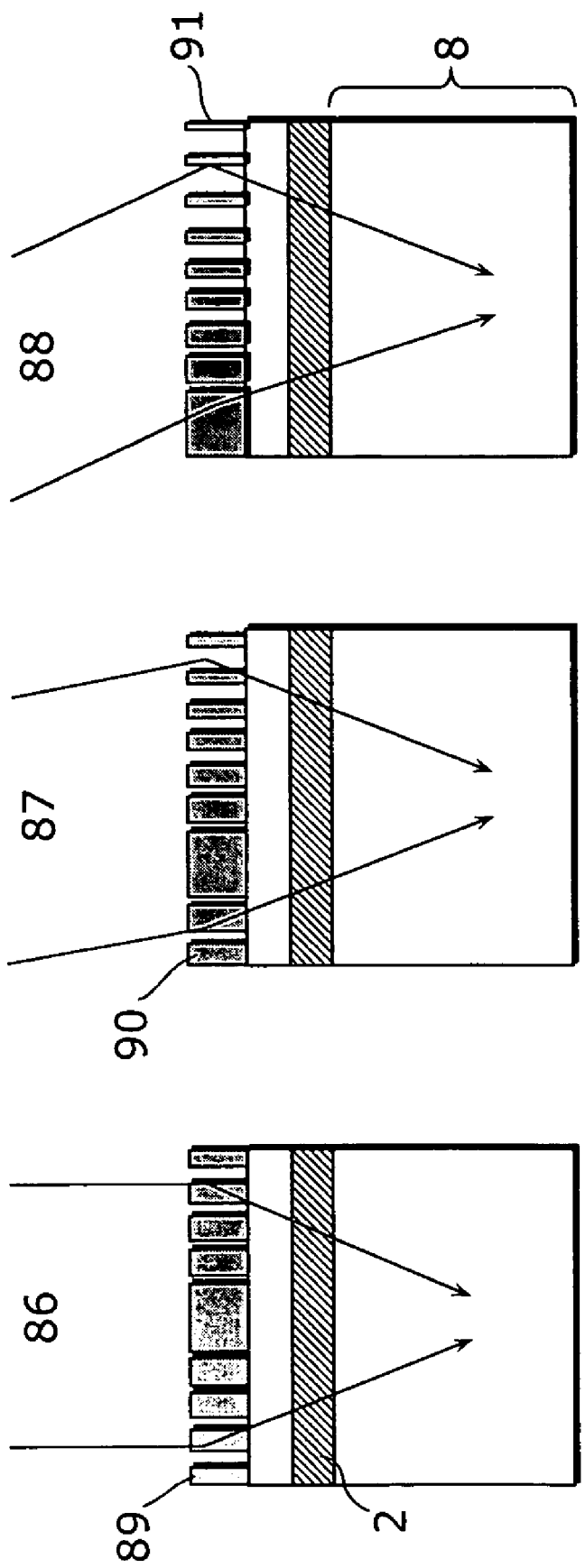

Contour Map of Hy at c T = 28.672 μm

9

LIGHT-COLLECTING DEVICE AND SOLID-STATE IMAGING APPARATUS

TECHNICAL FIELD

The present invention relates to a light-collecting device and a solid-state imaging apparatus that are used in a digital camera and the like.

BACKGROUND ART

Along with the widespread use of a digital camera, a camera-equipped cell phone and the like, the market of the solid-state imaging apparatus has been remarkably developed. In this flow of development, the needs have changed to the development of a high resolution and high sensitivity of the solid-state imaging apparatus. In recent years, following to the development of a thin digital camera and a thin cell phone, there is an increasing need for thinning a camera part. In other words, a lens used for the camera part becomes to have a short focal length, which means that light is incident on a solid-state imaging apparatus with a wide angle (a wide angle measured from a vertical axis of an incidence plane).

In the present, in a charged-coupled device (CCD) and a metal oxide semiconductor (MOS) imaging sensor that are commonly used as solid-state imaging apparatuses, semiconductor integrated circuits having multiple light-receiving parts are arranged in a two-dimensional array, in which a light signal from an object is converted into an electric signal.

The sensitivity of the solid-state imaging apparatus is defined based on an amount of output current of a light-collecting device to the amount of incident light so that leading the incident light certainly into the light-collecting device is an important factor for the improvement of sensitivity.

FIG. 4 is a diagram showing an example of a fundamental structure of a conventional general pixel. As shown in FIG. 4, light 106 (light indicated by dashed lines) which is incident vertically into a microlens 105 is dispersed into colors using one of red (R), green (G), and blue (B) color filters 2, and then converted into an electric signal at a light-receiving device 6. Since relatively high light-collection efficiency can be obtained, the microlens 105 is used in almost all solid-state imaging apparatuses.

There is a suggestion as an example of a structure in which a lens of each pixel is asymmetrically arranged in the solid-state imaging apparatus using the micro-lenses (e.g. refer to First Patent Reference).

Further, various technologies are disclosed as a solid-state imaging apparatus using Fresnel lenses (e.g. refer to Second Patent Reference and Third Patent Reference).

In the technology disclosed in the Second Patent Reference, a lens is made up of multiple layers which have different refractive indexes in concentric circles, and the central part has the highest refractive index as the refractive index decreases towards the peripheral part of the concentric circle structure. Further, in the technology disclosed in the Third Patent Reference, a thickness distribution type lens and a distributed index type lens which has a consecutive refractive index distribution by doping are used.

Patent Reference 1: Japanese Laid-Open Patent Application No. 2001-196568
Patent Reference 2: Japanese Laid-Open Patent Application No. 2000-39503
Patent Reference 3: Japanese Laid-Open Patent Application No. 5-251673

DISCLOSURE OF INVENTION

Problems that Invention is to Solve

From now on, in order to develop a solid-state imaging apparatus corresponding to a wide angle incident, it is necessary to lead the incident light incoming with a particular angle surely to a light-receiving device.

However, in the microlens, the light-collection efficiency decreases with increases in the incident angle. That is, as shown in FIG. 4, while the light 106 incoming vertically into the lens can be collected highly efficiently, the light-collection efficiency of light 107 incoming diagonally (light indicated by solid lines) into the lens decreases. This is because that the diagonally incident light 107 is blocked by an Al wiring 3 in a pixel so that it does not reach until the light-receiving device 6.

As described in the above, the solid-state imaging apparatus is made up of multiple pixels that are arranged in a two dimensional array. Therefore, in the case of incident light with a spread angle, the angle of incidence differs between the central pixels and the peripheral pixels (see FIG. 1). As the result, the light-collection efficiency of the peripheral pixels decreases than that of the central pixels.

FIG. 2 is a diagram showing an example of a conventional structure of a pixel in a periphery. The incident angle of the incident light is greater at pixels in the periphery. Therefore, the improvement of the light-collection efficiency is sought by displacing electric wiring parts to the inner direction which means by shrinking.

FIG. 3 is a diagram showing a dependency on incident angles of the light-collection efficiency in the conventional solid-state imaging apparatus using microlens. As shown in FIG. 3, it can be seen that the light with the incident angle up to 20° can be collected high efficiently. However, the light-collection efficiency rapidly decreases as the incident angle becomes higher than 20°. As the result, currently, the amount of light collected in the peripheral pixels is about 40 percent of that in the central pixels, and the sensitivity of whole pixels is limited by the sensitivity of the peripheral pixels. This value further decreases as the pixel size decreases so that its application to an optical system with a short focal length such as a small camera becomes very difficult. Furthermore, in a manufacturing method thereof, there is a problem that further circuit shrinking cannot be made.

Accordingly, considering the aforementioned problems, it is an object of the present invention to provide an optical device and the like which can collects light incoming with a higher angle than the existing microlens in order to realize a solid-state imaging apparatus applicable to an optical system (an optical system with a high incident angle θ) with a short focal length for a thin camera.

Means to Solve the Problems

In order to solve the problems, the present invention is a light-collecting device which collects incident light, including: a substrate into which the incident light is incident; above the substrate, a plurality of light-transmitting films formed in a region into which the incident light is incident, wherein the light-transmitting film forms a zone in which a width of each zone is equal to or shorter than a wavelength of the incident light, each zone shares a center point which is located at a position displaced from the center of the device, and the plurality of the light-transmitting films form an effective refractive index distribution.

Accordingly, an optical device which can collect incident light with a high incident angle than an existing microlens can be realized.

Further, by controlling a refractive index distribution of the optical device, the followings can be manufactured: a deflecting device which can control an outgoing angle of light which incidents with a particular angle; and a light-collecting device which can collect the incident light at an arbitral position.

In the light-transmitting films, a phase modulation of the light transmitting film changes depending on a wavelength of light to be inputted or a representative wavelength of a color to be inputted. Consequently, a structure of a lens in each pixel can be optimized depending on a wavelength of the incident light so that the difference of light-collection efficiency depending on colors can be avoided.

Further, in the light-transmitting films, a phase modulation of the light-transmitting film changes depending on a setting of a focal length of the light to be inputted. Consequently, the focal length of the incident light can be changed so that a lens appropriate to each pixel structure can be designed.

Or, the phase modulation of the light-transmitting film changes depending on an incident angle of an incident light component with the strongest light intensity, and the structure of the lens in each pixel can be optimized depending on the incident angles of the incident light. Therefore, the decrease of the light-collection efficiency along with the increase of the incident angle can be avoided.

It is preferred that a phase modulation $\phi(x)$ of the light-transmitting film depending on a distance x in an in-plane direction satisfies the following equation, $$\phi(x) = -\frac{k_0 n_1}{2f} x^2 - k_0 n_0 x \sin\theta \qquad \text{[Equation 1]}$$
$$k_0 = \frac{2\pi}{\lambda}$$

where a wavelength of incident light is $\lambda$, a focal length in which light is gathered is f, an incident angle of the light is $\theta$, a refractive index of an incoming side medium is $n_0$, and a refractive index of an outgoing side medium is $n_1$. Accordingly, the light can be collected only in a first Fresnel zone so that high efficient light collecting with small light-collecting loss can be allowed.

Further, it is preferred that the phase modulation $\phi(x)$ of the light-transmitting film approximately satisfies the following equation, $$\phi(x) = -\frac{k_0 n_1}{2f} x^2 - k_0 n_0 x \sin\theta + 2m\pi \qquad \text{[Equation 2]}$$
$$k_0 = \frac{2\pi}{\lambda}$$

m=natural number

Accordingly, the light can be collected in plural Fresnel zones and the phase modulation can be increased so that a light-collecting device which is resistant to incident light with higher incident angle can be realized.

It is preferred to approximately satisfy the following equation, $$\Delta n(x) = \Delta n_{max}\left[\frac{\phi(x)}{2\pi} + C\right] \qquad \text{[Equation 3]}$$

where the maximum value of the light-transmitting film refractive indexes is $n_0+\Delta n_{max}$, and a difference with $n_0$ in the refractive index distribution in an in-plane direction of the light-transmitting film is $\Delta n(x)$. Accordingly, a distributed index lens for high light-collection efficiency which can collect light incident with a particular angel at an arbitral position can be manufactured.

Further, it is preferred to satisfy the following equation in the distributed refractive index lens, $$k_0 \Delta n_{max} L = 2\pi \qquad \text{[Equation 4]}$$

Accordingly, the maximum phase modulation by the distributed index lens corresponds to one phase of the incident light and the light-collecting loss becomes the minimum. Therefore, high efficient light collecting can be achieved.

It is preferred to approximately satisfy the following equation, $$L(x) = L_{max}\left[\frac{\phi(x)}{2\pi} + C\right] \qquad \text{[Equation 5]}$$

where the maximum value of thickness of the light-transmitting film is $L_{max}$, and the thickness distribution is $L(x)$. Accordingly, a film thickness distribution lens with high efficient light-collection efficiency which can collect light incident with a particular angle at an arbitral position can be manufactured.

Further, in the film thickness distribution lens, it is preferred to satisfy the following, $$k_0 \Delta n L_{max} = 2\pi \qquad \text{[Equation 6]}$$

Accordingly, the maximum phase modulation by the distributed index lens corresponds to one phase of the incident light and the light-collecting loss becomes the minimum. Therefore, high efficient light collecting can be achieved.

In the distributed index lens, film thicknesses are the same so that the process becomes easier and the manufacturing costs can be reduced.

In addition, in the distributed index lens, only the Fresnel zone area can be used by setting the film thicknesses unevenly so that the light-collection efficiency is improved.

Further, it is proposed that, in the distributed index lens, each area divided by a constant value of a line width in an in-plane direction which is equal to or shorter than a wavelength of light to be incident form a concentric circle, in which a ratio of the sum of line widths is different for each area. With this method, a distributed index device can be easily manufactured by changing an effective refractive index by changing a line width of a concentric circle.

Herein, it is preferred that a shape of a cross-section of a light-transmitting film is a rectangular. Consequently, more rapid refractive index change is caused and the light-collection efficiency is increased.

Also, it is proposed that, in the distributed index lens, a light-transmitting material whose diameter is equal to or smaller than a wavelength of a light to be incident in an in-plane direction is unevenly dispersed. Using this method, a distributed index device can be easily manufactured by changing an effective refractive index by changing spaces of adjacent light-transmitting materials.

Further, it is proposed that, in the distributed index lens, the refractive indexes or the film thicknesses are changed continuously and unevenly in an in-plane direction. Consequently, a phase of incident light continuously changes so that the light-collection efficiency is increased.

Furthermore, it is proposed that, in the thickness distribution lens, the thicknesses are discretely and unevenly changed in an in-plane direction. Using this method, the process becomes easier while maintaining high light-collection efficiency.

In addition, the light-transmitting film is made of a high refractive transmitting material whose refractive index is a value in a range from 1.45 to 3.4.

Further, each of the light-transmitting films includes one of $TiO_2$, $ZrO_2$, $Nb_2O_5$, $Ta_2O_5$, $Si_3N_4$ and $Si_2N_3$. They are high refractive index materials. Therefore, a thickness of the light-transmitting film can be thinned, and a manufacturing process becomes easier.

Further, each of the light-transmitting films includes one of $SiO_2$ doped with B or P, that is Boro-Phospho Silicated Glass, and Teraethoxy Silane. They are materials generally used in a conventional semiconductor process. Therefore, a light-collecting device can be easily manufactured, and a manufacturing cost can be reduced.

Further, each of the light-transmitting films includes one of benzocyclobutene, polymethymethacrylate, polyamide and polyimide. Since resins allow direct processing, a light-collecting device can be manufactured by nanoimprinting. Therefore, mass production is encouraged.

Further, a solid-state imaging apparatus includes arranged unit pixels, each of which includes a light-collecting device and a light-receiving device which receives the light collected by the light-collecting device and converts the light into electric charge. Consequently, the light-collection efficiency of a pixel can be increased without using micro-lenses. Accordingly, a high-resolution and high-sensitive solid-state imaging apparatus can be realized.

Further, the light-collecting apparatus is formed in a whole area of a corresponding pixel area. Consequently, a place from which light is incoming becomes the whole pixel area, and light-collecting loss is reduced.

Further, the solid-state imaging apparatus at least includes: a first unit pixel for a first color light out of the incident light; and a second unit pixel for a second color light which has a typical wavelength that is different from a typical wavelength of the first color light; wherein the first unit pixel includes a first light-collecting device, and the second unit pixel includes a second light-collecting device in which a focal length of the second color light is equal to a focal length of the first color light in the first light-collecting devices. Consequently, a structure of a lens of each pixel can be optimized depending on a wavelength of the incident light so that a difference of light-collection efficiency depending on a color can be avoided.

Further, the focal length is set to a predetermined value by controlling a refractive index distribution of the light-transmitting film. Consequently, the focal length of the incident light is changeable so that a lens which is appropriate to each pixel structure can be designed.

Further, in the light-collecting device, the light-collection efficiency in the light-receiving device which receives light having an incident angle having the greatest light intensity is set to be a predetermined value or more by controlling the refractive index distribution of the light-transmitting film. Consequently, a structure of a lens in each pixel can be optimized depending on the incident angle of the incident light. Therefore, the decrease of the light-collection efficiency along with an increase of the incident angle can be avoided.

Further, each unit pixel further includes: a wiring layer having an aperture above a light-receiving device, on a light-outgoing side plane of the light-collecting device, and a focal point of light collected by the light-collecting device matches a position of the aperture of the wiring layer. Consequently, the best use of the light-receiving place is allowed and the light-collection efficiency is increased.

Further, the unit pixel includes a light-collecting lens on an outgoing side of a plane of the deflecting device or the light-collecting device. Consequently, the light-collecting loss is decreased in a pixel and the deflecting device or the light-collecting device is easily designed.

Further, unit pixels are arranged in a two-dimensional array. Consequently, a high sensitive two-dimensional image inputting apparatus can be realized.

Further, a refractive index distribution of the light-transmitting film is different between a light-collecting device of the unit pixel placed in a center of a plane on which unit pixels are placed and a light-collecting device of a unit pixel for a color same as the unit pixel placed in the center. Consequently, a structure of a lens can be optimized depending on positions of pixels on the solid-state imaging apparatus and a shrinking structure of the solid-state imaging apparatus can be modified. Furthermore, a manufacturing method of a light-collecting device becomes easier and a sensitivity of a whole light-collecting device is increased.

Further, in the unit pixels located in a center of a plane on which the unit pixels are formed, a central axis of each of the light-receiving devices is placed to match a central axis of each of the light-collecting devices, and in the unit pixels located in the periphery of the center of the plane, a central axis of each of the light-receiving devices and a central axis of each of the light-collecting devices are placed toward the center of the plane. Consequently, a low-degree of shrinking structure can be used so that the light-collection efficiency in the peripheral pixels is more increased.

Effects of the Invention

A solid-state imaging apparatus of the present invention has the lens structure described in the above so that development of its degree of resolution and sensitivity and an easier manufacturing method can be realized.

BRIEF DESCRIPTION OF DRAWINGS

FIGS. 17A to 17C are diagrams, each of which shows a fundamental structure of one pixel according to the third embodiment.

FIGS. 18A to 18C are diagrams, each of which shows a refractive index distribution of a lens according to the third embodiment.

FIGS. 22A to 22C are diagrams, each of which shows a fundamental structure of one pixel according to the fifth embodiment.

Figure 1:
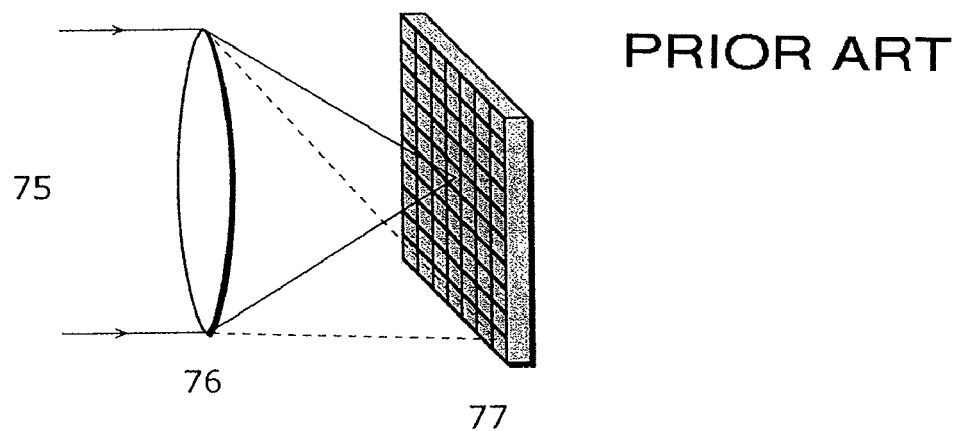
FIG. 1 is a diagram showing an example of a fundamental structure of a solid-state imaging apparatus according to the prior art.
Figure 2:
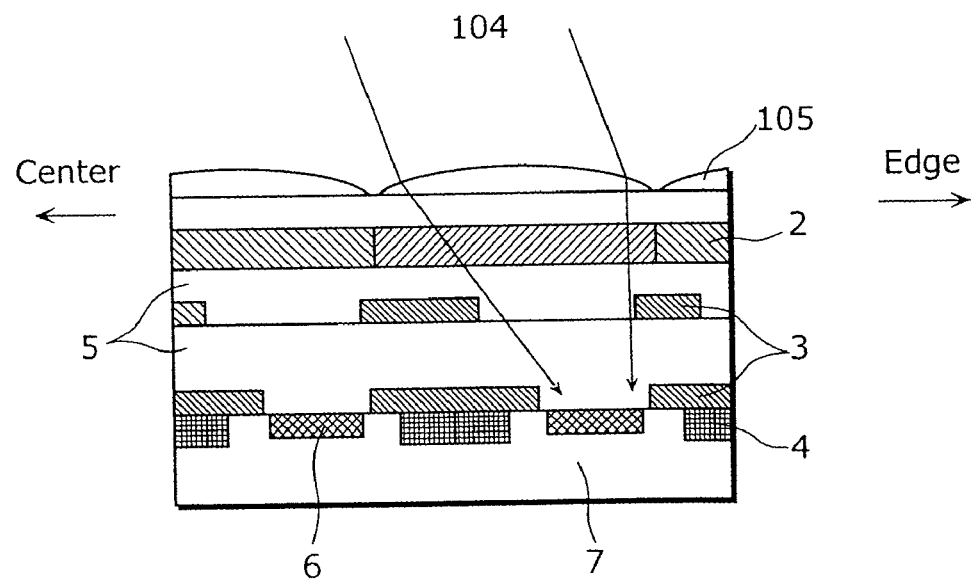
FIG. 2 is a diagram showing an example of a structure of a peripheral pixel according to the prior art.
Figure 3:
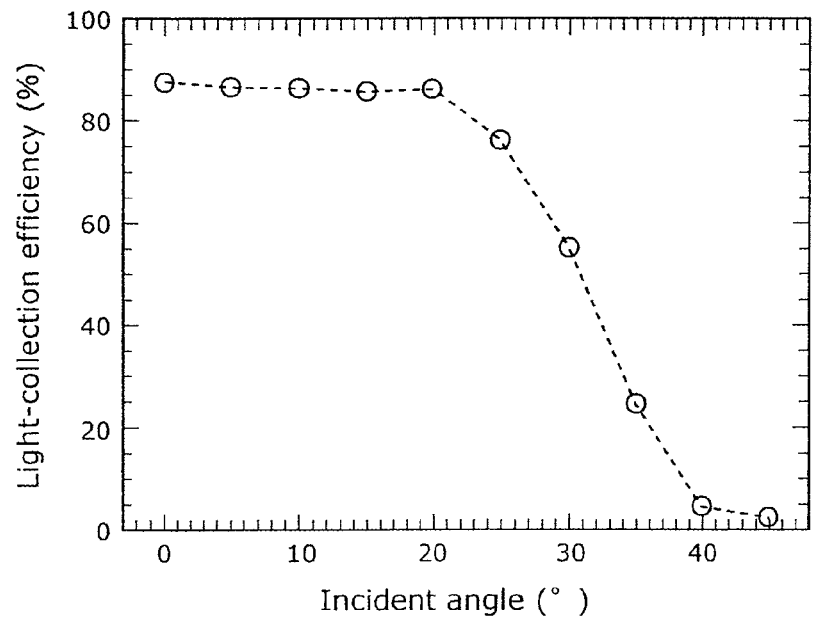
FIG. 3 is a diagram showing dependency on incident angles of light-collection efficiency of a conventional solid-state imaging apparatus using microlenses.
Figure 4:
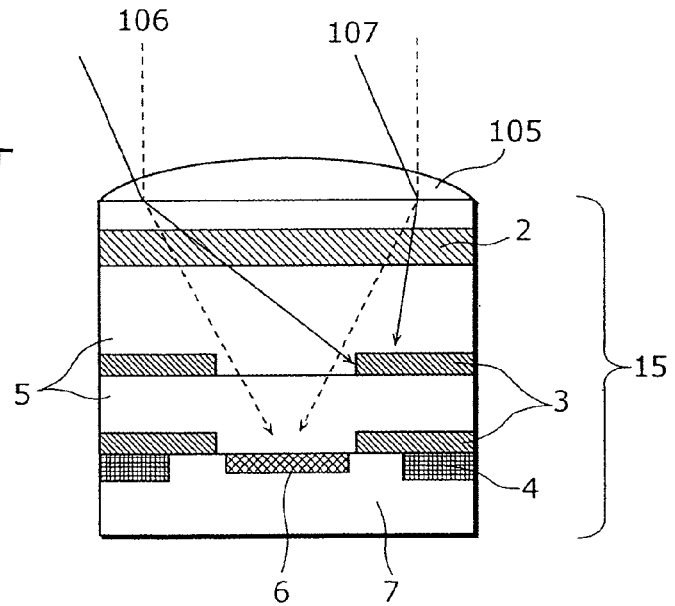
FIG. 4 is a diagram showing an example of a fundamental structure of a conventional general pixel.

NUMERICAL REFERENCES 1 distributed index lens (concentric circle structure)
2 color filter
3 Al wiring
4 signal transmitting unit
5 planarized layer
6 light-receiving device (Si photodiode)
7 Si substrate
8 semiconductor integrated circuit (including 2 to 7)
9 incident light
10 high refractive index region [$GeO_2$ (n=1.65)]
11 low refractive index region [$TiO_2$ (n=1.45)]
16 incident angle
17 exit angle
19 distributed index lens
101 distributed index lens (concentric circle structure type)
102 low refractive index material [air (n=1.0)]
103 high refractive index material [$TiO_2$ (n=1.65)]
104 incident light (oblique incidence)
105 microlens
106 incident light (vertical incidence)
107 incident light (oblique incidence)
108 distributed refractive index lens (only deflection component)
109 in-layer lens
112 step-like shaped film thickness distribution lens
20 light-receiving part
21 pixel
26 phase modulation
27 first zone
28 second zone
29 third zone
201 light-outgoing side region (refractive index $n_1$)
202 lens region (refractive index $n_0+\Delta n(x)$)
203 light-incoming side region (refractive index $n_1$)
204 incident light 1
205 incident light 2
206 optical path length difference 1 (deflection component)
207 optical path length difference 2 (light-condensing component)
208 focal length
33 high refractive index material ($TiO_2$)
34 low refractive index material (air)
35 width of adjacent divided areas
36 resist
37 $TiO_2$
38 mold
39 Ar ion milling
40 wet etching
42 semiconductor integrated circuit (including 2 to 7)

43 Si₂
44 resist
45 electron beam lithography
46 electron beam evaporation
47 Au
48 ion implantation
481 Ge
49 film thickness distribution lens (single zone is used)
50 film thickness distribution lens (multiple zones are used)
57 one pixel
58 incident light (vertical incidence)
59 shift of focal point (f×tan q)
62 light-collecting spot
63 leakage light
66 incident light (0° incidence)
67 incident light (α/2° incidence)
68 incident light (α° incidence)
69 distributed index lens for 0° incident light
70 distributed index lens for α/2° incident light
71 distributed index lens for α° incident light
75 incident light
76 optical lens
77 solid-state imaging apparatus
78 light that is incident onto a center part of the apparatus
79 distributed index lens for the center part of the apparatus
80 light that is incident onto a periphery of the apparatus
81 distributed index lens for the periphery of the apparatus
86 incident light (0° incidence)
87 incident light (low angle incidence)
88 incident light (high angle incidence)
89 distributed index lens for 0° incidence
90 distributed index lens for low angle incidence
91 distributed index lens for high angle incidence

BEST MODE FOR CARRYING OUT THE INVENTION

Hereafter, the embodiments of the present invention are described in specific with references to drawings.

First Embodiment

Figure 5:
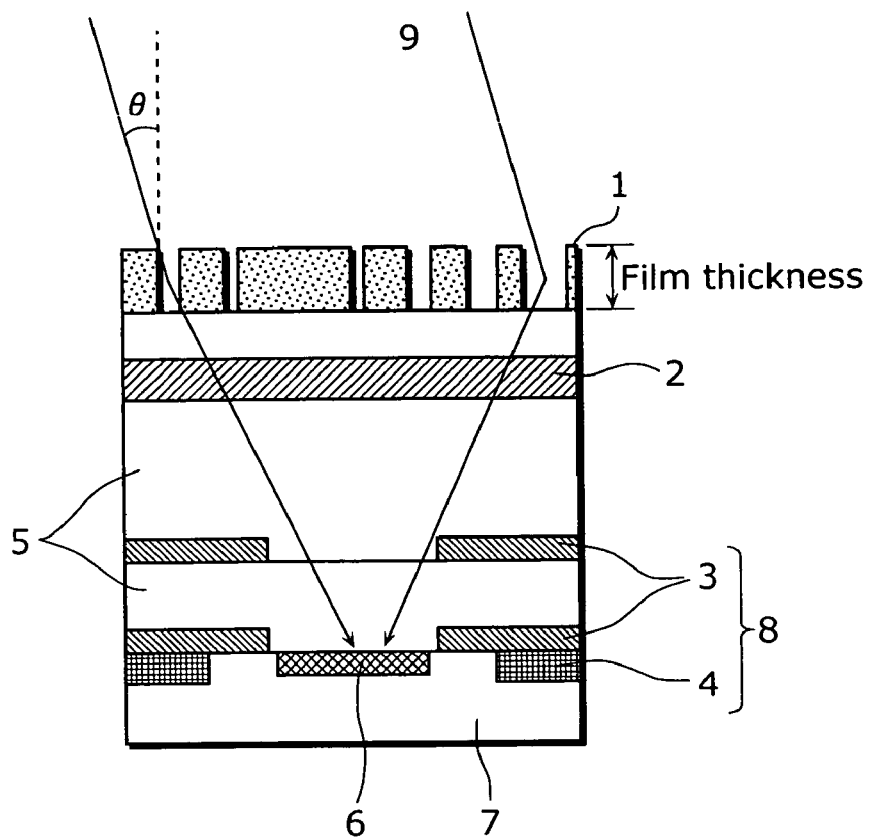
FIG. 5 is a diagram showing a fundamental structure of a solid-state imaging apparatus according to a first embodiment.
Figure 6:
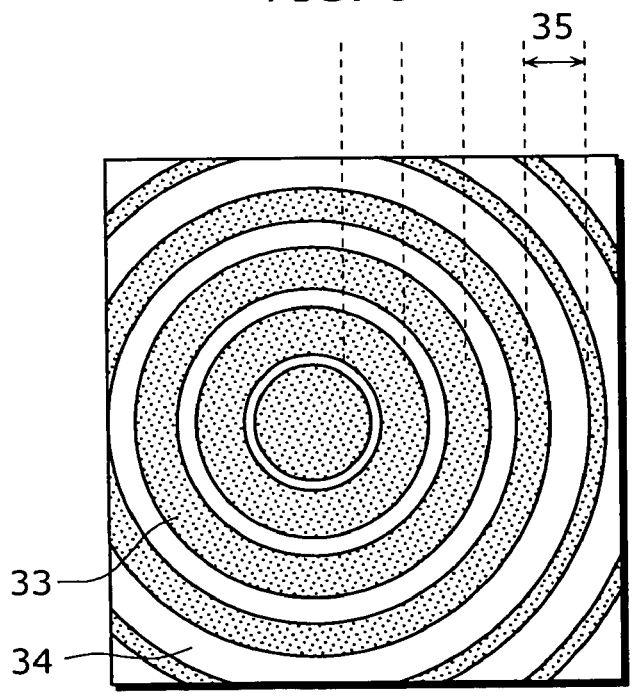
FIG. 6 is a diagram showing a top view of a distributed index lens according to the first embodiment.

FIG. 5 is a diagram showing a fundamental structure of a solid-state imaging apparatus according to a present embodiment. Each pixel (2.8 μm square in size) includes a distributed index lens (also called as "a group of light-transmitting films") 1, a color filter 2 for green (G), Al wirings 3, a signal transmitting unit 4, planarized layers 5, a light-receiving device (Si photodiodes) 6, and a Si substrate 7. FIG. 6 is a diagram showing a top view of the distributed index lens.

A concentric circle structure in the distributed index lens 1 is made up of high refractive index materials 33 [TiO₂ (n=2.53)] and low refractive index materials 34 [air (n=1.0)]. The width 35 of adjacent divided areas is, for example, a constant 200 nm. Also, a film thickness t is 0.5 μm.

As shown in FIG. 6, each of the light-transmitting films has a zone in a predetermined line width, and the light-transmitting films form an off-centered centrosymmetric shape. The concentric high refractive index light-transmitting materials 33 and the concentric low refractive index light-transmitting materials 34 respectively form zones. Accordingly, the distributed index lens 1 is also a group of the multiple zones. It should be noted that the width of a zone is called a "line width".

Here, the "divided area" is an area concentrically divided with an arbitral width equal to a wavelength of the incident light or shorter than the wavelength.

Figure 7:
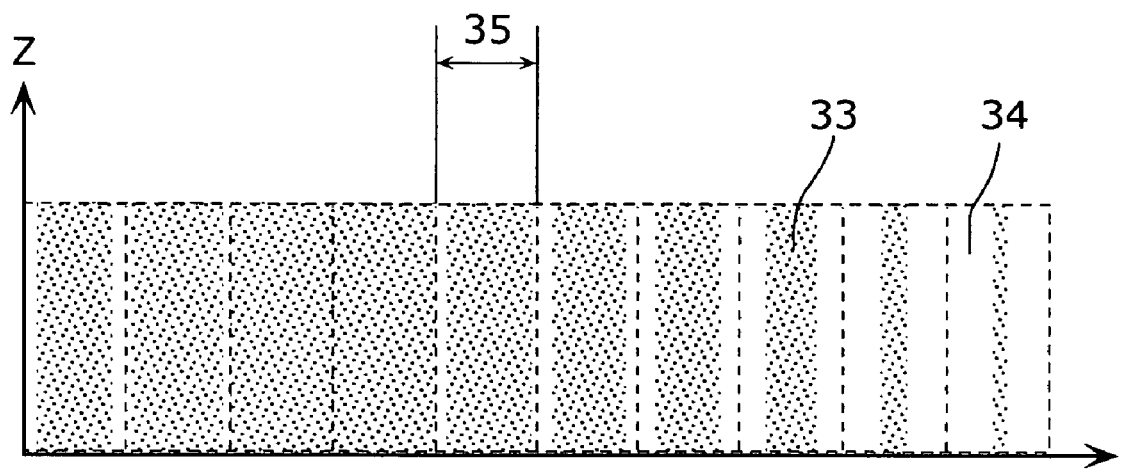
FIG. 7 is a diagram showing a cross-section of a structure of the distributed index lens according to the first embodiment.

FIG. 7 is a diagram showing a cross-sectional structure of the distributed index lens. The line width of each light-transmitting film (zone) in the concentric circles is widest in a center part of the concentric circle structure, and the line width gradually decreases towards outer rings. In the case where the width of each zone is as long as or shorter than the wavelength of incident light, an effective refractive index sensed by light can be calculated by a volume ratio between high refractive index material and the low refractive index material in a divided area. The best characteristic of the present structure is that the refractive index distribution can be freely controlled only by changing the line widths.

Figure 8:
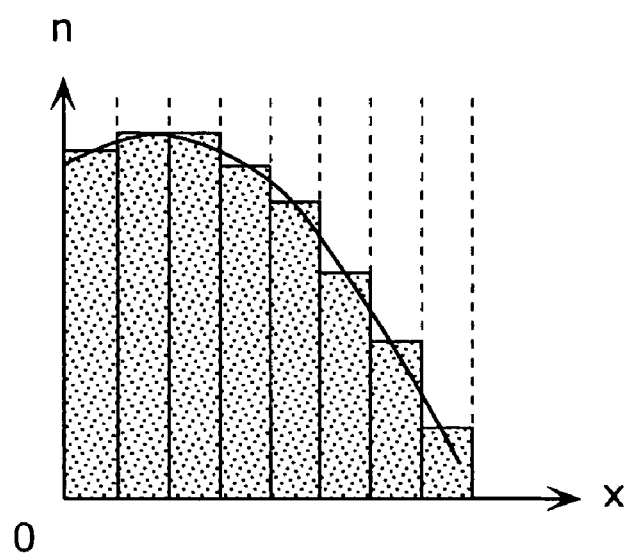
FIG. 8 is a diagram showing a refractive index distribution of a lens according to the first embodiment.

The change of the refractive index herein is shown in FIG. 8 and is asymmetric. The refractive index of the lens is the highest in the center part of the concentric circles and gradually decreases towards the edge. In other words, as the incident light 9 shown in FIG. 5, the refractive index distribution sensed by light incoming from a certain direction is asymmetric to the center of the distributed refractive index lens 1.

The parabola indicated by a solid line in FIG. 8 shows a refractive index distribution for collecting incident light with a wavelength λ (550 nm) in a focal length f (4.43 μm), and it is indicated by the following equation:

[Equation 7]

$$\Delta n(x) = \Delta n_{max}\left[\frac{\phi(x)}{2\pi} + C\right] \quad (1)$$

Here, $\Delta n(x)$ is a difference of refractive indexes (this case is 1.53) between an incoming side medium and a lens material, $\phi(x)$ is a phase modulation caused by the light-transmitting films, and the equation is defined by a quadratic function by a distance x from the pixel center.

Figure 9A:
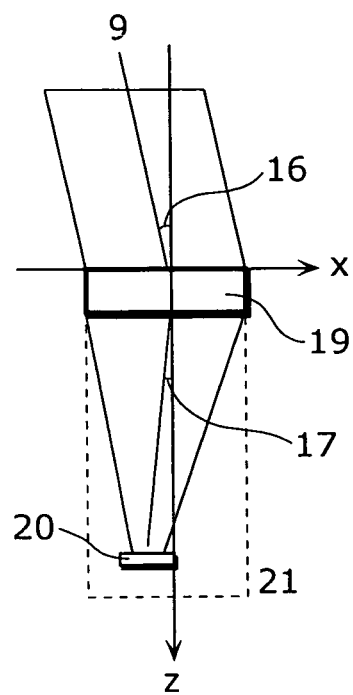
FIGS. 9A to 9C are diagrams for explaining a direction of propagation of light in the first embodiment.
Figure 9B:
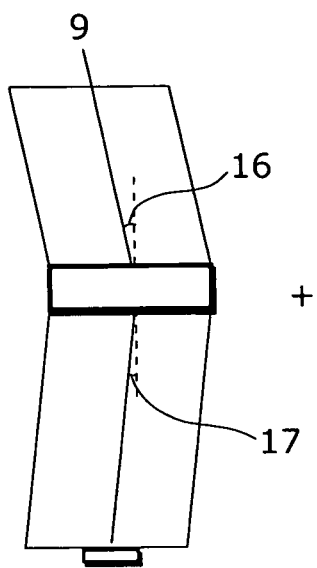
Figure 9C:
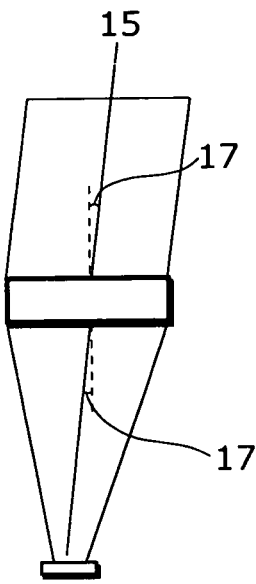

In the present embodiment, a light propagation direction is controlled by modulating a phase of incident light. FIGS. 9A to 9C are conceptual diagrams for explaining propagation directions of the light.

The light-transmitting film 19 according to the present embodiment is a light-collecting device for collecting light that is incident with a specific angle at an arbitral position. It can be divided mainly into two components. First component is a deflection component which outputs, with an arbitral angle 17, the incident light 9 incoming at a specific angle 16. The other component is a light-condensing component which collects light in an arbitral focal length. The following design is necessary for generating such deflection component and light-condensing component.

Figure 10:
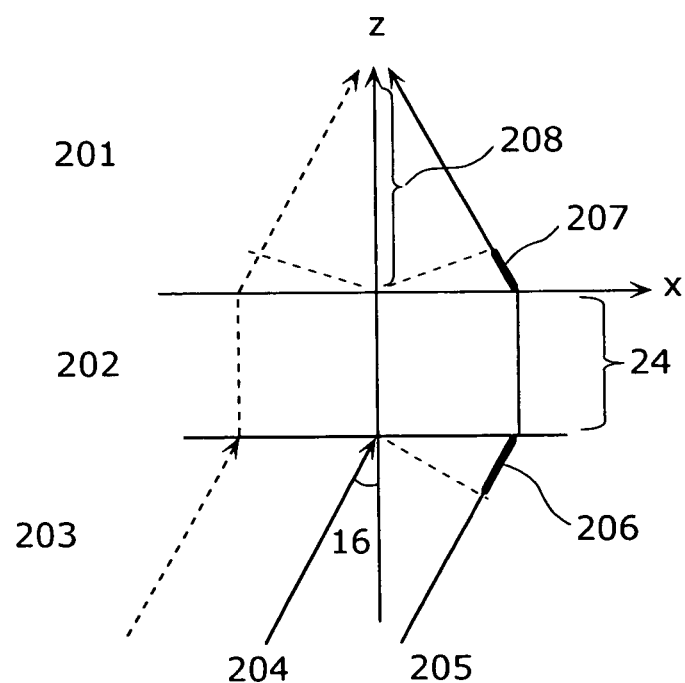
FIG. 10 is a diagram showing conditions for collecting light which is incident diagonally into a light-transmitting film, on a Z axis in the first embodiment.

FIG. 10 shows conditions for collecting light 204 and 205 incoming diagonally to the light-transmitting film on a Z axis.

In order to collect incident light 204 and 205 whose phases are different from each other in a focal length 208, optical path length differences 206 and 207 are necessary between the incident light 204 and the incident light 205. Herein, the optical path length difference 206 is an optical path length difference for deflecting light, and the optical path length difference 207 is necessary for collecting light. A phase modulation $\phi A$ by the deflection component and a phase modulation $\phi B$ by the light-condensing component are indicated in the following equations:

[Equation 8]

$$\phi A = -k_0 n_0 x \sin\theta \quad (2)$$

[Equation 9]

$$\phi B = -\frac{k_0 n_1}{2f} x^2 \quad (3)$$

where $k_0$ is the wave number of the incident light, f is the focal length in which the light is focused, θ is the incident angle of light, $L_{max}$ is the lens thickness, $n_0$ is the refractive index of incoming side medium, and $n_1$ is the refractive index of outgoing side medium. Herein, a total phase modulation φ(x) caused by the light-transmitting film is described as:

[Equation 10]

$$\phi(x) = -\frac{k_0 n_1}{2f} x^2 - k_n n_0 x \sin\theta \quad (4)$$

or

[Equation 11]

$$\phi(x) = -\frac{k_0 n_1}{2f} x^2 - k_n n_0 x \sin\theta + 2m\pi \quad (5)$$

Figure 11:
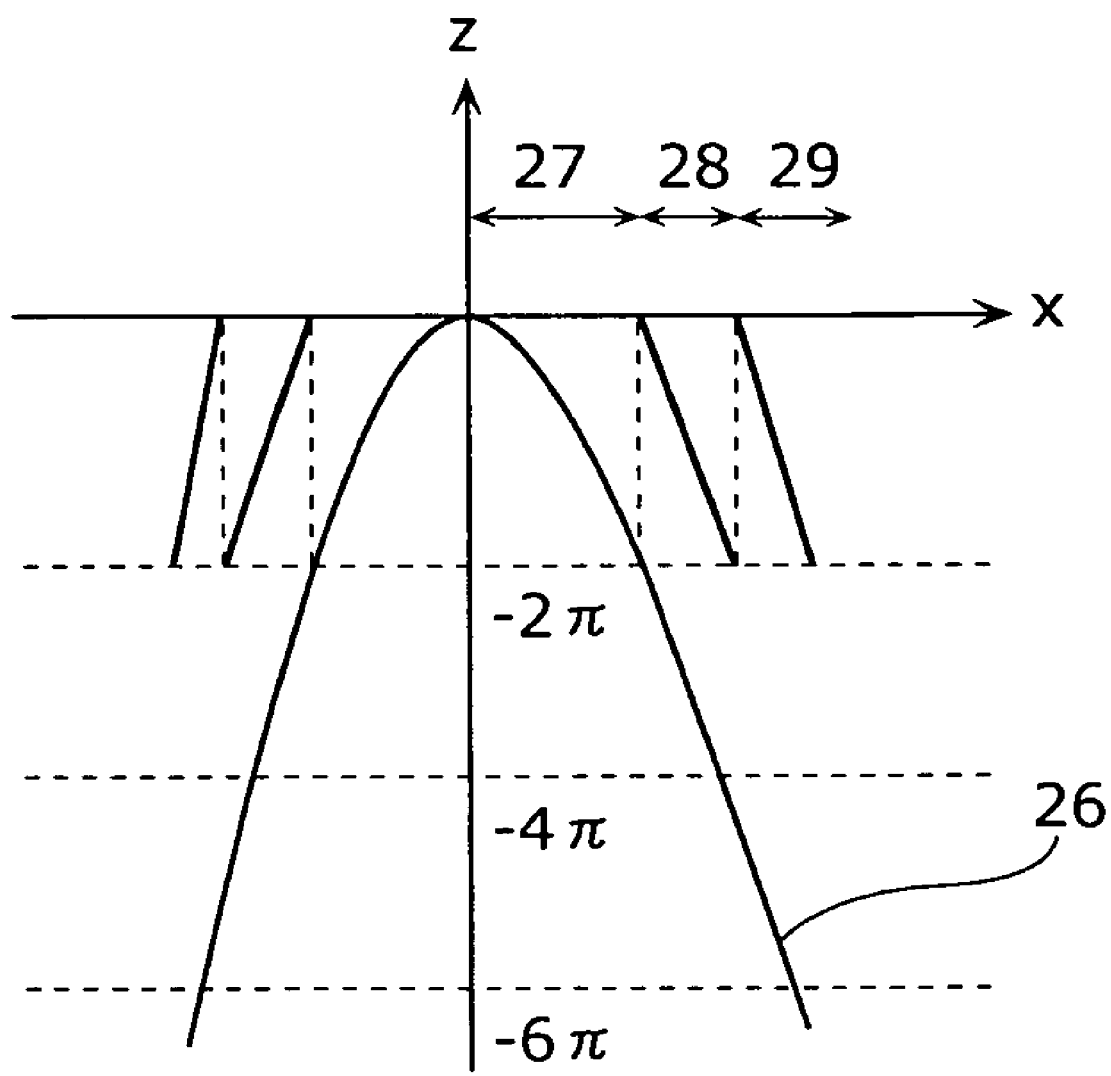
FIG. 11 is a diagram showing a phase modulation of light according to the first embodiment.

Herein, as described in FIG. 11, the phase modulation 26 described by the equation (4) does not have segments in the Fresnel zone area so that a phase changes continuously. In contrast, the phase modulation described by the equation (5) is a phase modulation obtained by dividing the equation (4) by 2π. The phase modulation consists of not only the first Fresnel zone area 27, but also the second Fresnel zone area 28 and the third Fresnel zone area 29. The Fresnel zone area is distinguished for every phase so that an effective phase modulation is equal between the equation (4) and the equation (5).

In the equation (1), a phase modulation is applied to the incident light based on the refractive index distribution. However, a light-transmitting film having a film thickness distribution L(x) described by the following equation (6) may be formed.

[Equation 12]

$$L(x) = L_{max} \left[ \frac{\phi(x)}{2\pi} + C \right] \quad (6)$$

Further, the condition for obtaining the phase difference of 2π in each Fresnel zone area boundary in the case of forming the light-transmitting film having plural Fresnel zone areas is as follows:

[Equation 13]

$$k_0 \Delta n_{max} L = 2\pi \text{ or } k_0 \Delta n L_{max} = 2\pi \quad (7)$$

In the case where the light-transmitting film is thin, there is no loss factors in general so that the light-collection efficiency is hundred percent if the equation (7) is satisfied.

Second Embodiment

Figure 12A:
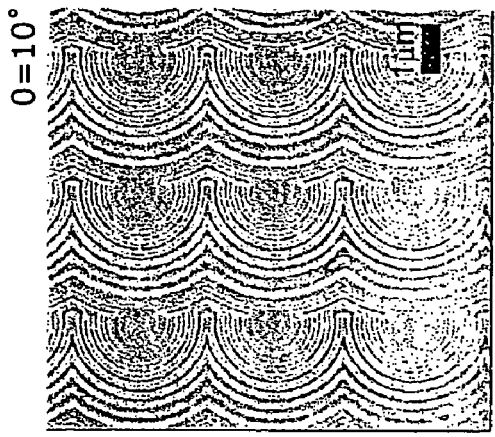
FIGS. 12A to 12C are scanning electron microscope photographs of distributed index lenses which form a concentric circle structure according to a second embodiment.
Figure 12B:
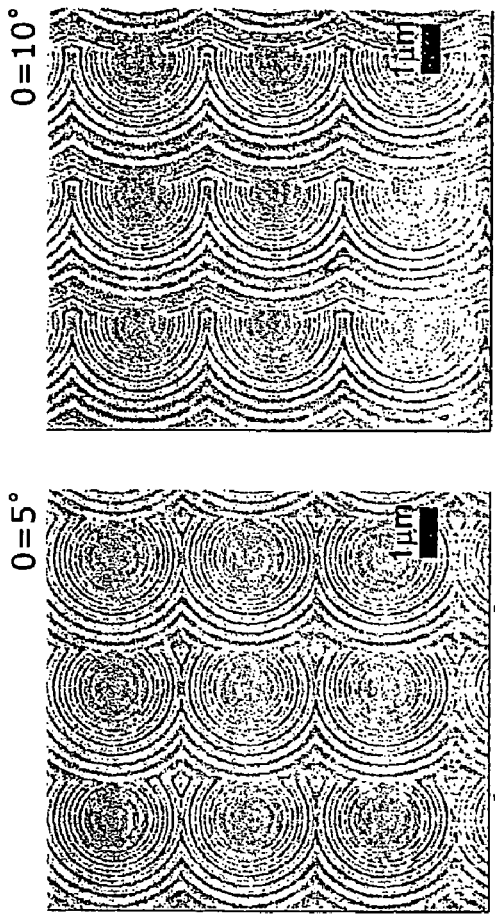
Figure 12C:
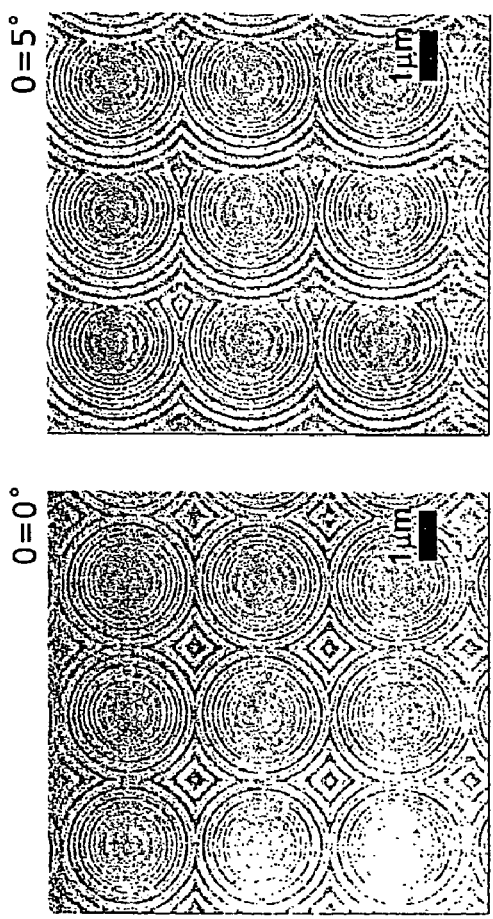

FIGS. 12A to 12C are Scanning Electron Microscope (SEM) photographs of a distributed index lens having a concentric circle structure according to a second embodiment of the present invention. The distributed index lens is realized by using a difference of refractive indexes between resist (ZEP 520: refractive index 1.56) for electron beam (EB) lithography and air, and is formed on a fused silica substrate by the EB lithography. The details about the formation method are described later. A diameter of the lens is 2.8 μm, a thickness of the lens is 1 μm, and a periodic circle is 0.2 μm. The refractive index distribution is designed by defining that the focal length is 5 μm, the wavelength of incident light is 0.55 μm, a refractive index of the incoming side medium is 1.45 (fused silica) and a refractive index of the outgoing side medium is 1 (air).

FIG. 12A is a SEM photograph of a top surface of the distributed index lens with an incident angle set value of 0° (θ=0°). The plural concentric circles (FIG. 12A) that are complete round are arranged. As the incident angle set value increases in the order of 5° (FIG. 12B) and 10° (FIG. 12C), the concentric circles are shifted in a right direction on the paper. This indicates that the area with a high effective refractive index shifts to the right.

Figure 13C:
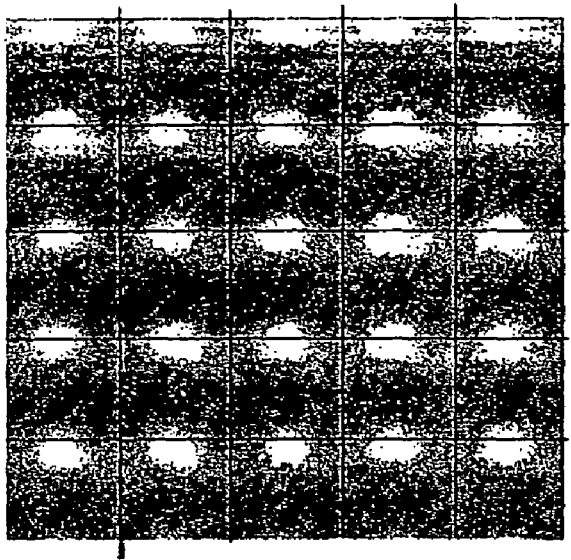
FIGS. 13A to 13C are optical microscope photographs of light-collecting spots in the case where light is incident in a direction vertical to a lens surface according to the second embodiment.
Figure 13B:
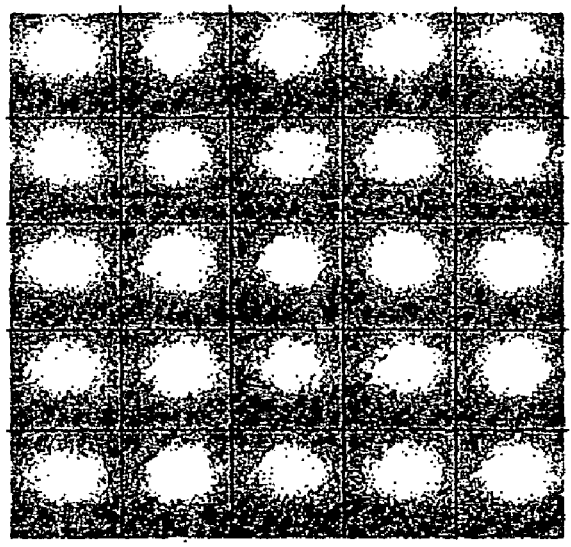
Figure 13A:
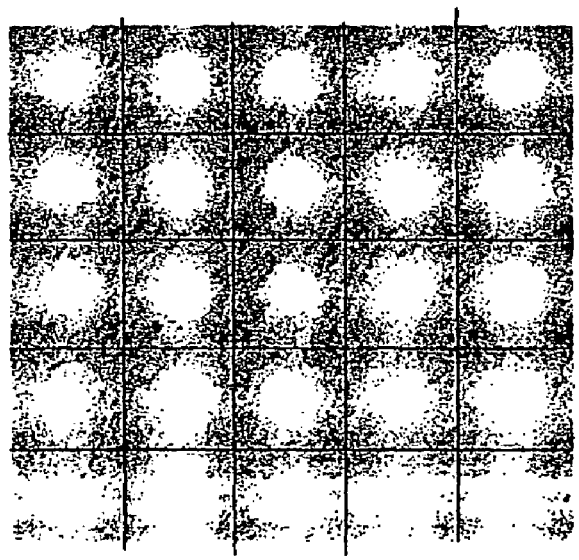

FIGS. 13A to 13C show optical microscope photographs (transmission measurement) of light-collecting spots in the case where light is incident on a lens surface in a vertical direction. A wavelength of a light source herein is 0.55 μm. It can be recognized that the light-collecting spots are shifting towards right side on the paper (in a direction of higher effective refractive index). This shift from the center is caused by a deflection component of the distributed index lens of the present embodiment.

Figure 14A:
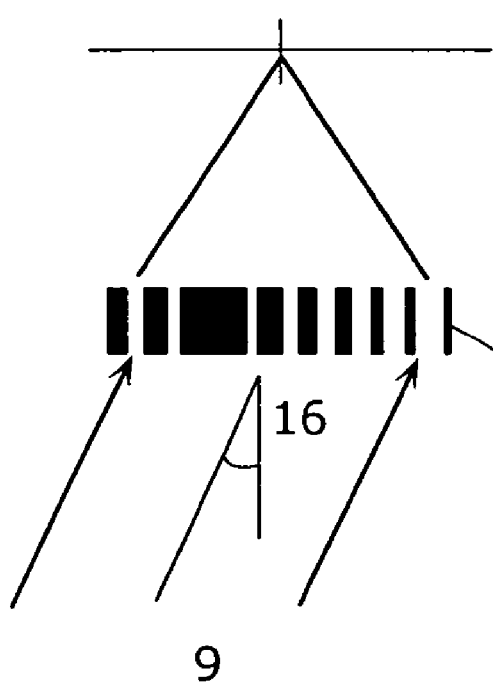
FIGS. 14A and 14B are diagrams showing changes of a focal position in the case where light is incident diagonally or vertically to the lens surface according to the second embodiment.
Figure 14B:
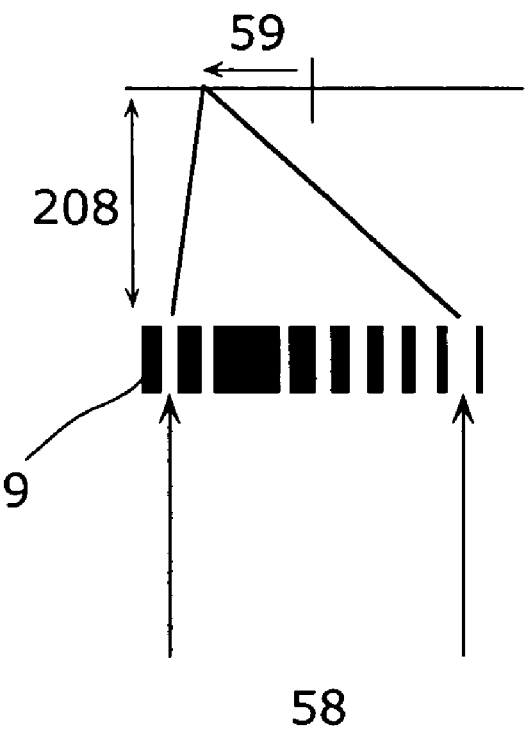

FIG. 14 shows a change of a focal point in the case where light is incident diagonally (FIG. 14A) or vertically to the lens (FIG. 14B). When light is incident vertically to the lens which is designed to collects light incoming with an angle 16 at a pixel center (FIG. 14A), a light-collecting spot is appeared at a position where it is shifted for f×tan from the pixel center (FIG. 14B). Herein, by measuring the amount of shifts from the center, it can be judged to which degree the manufactured lens corresponds. The experimental values of the manufactured lens corresponding to 5° and 10° are respectively 5.2° and 11.1°. Thus, it can be said that it is manufactured with very good precision.

Figure 15A:
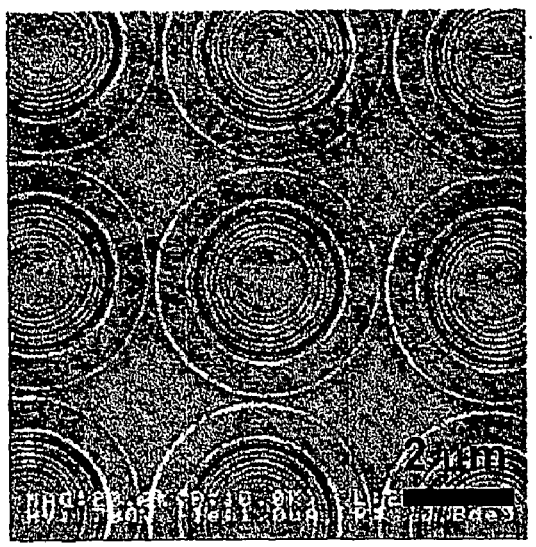
FIGS. 15A to 15D are diagrams showing a comparison between the case of a circular incident window area and the case of a square incident window area according to the second embodiment.
Figure 15B:
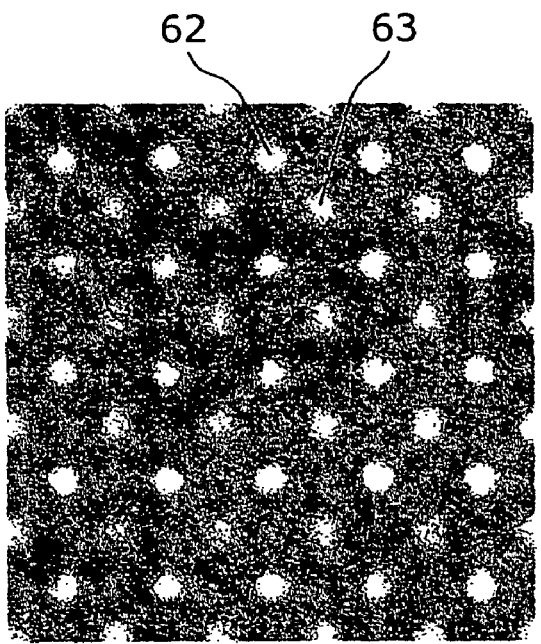
Figure 15C:
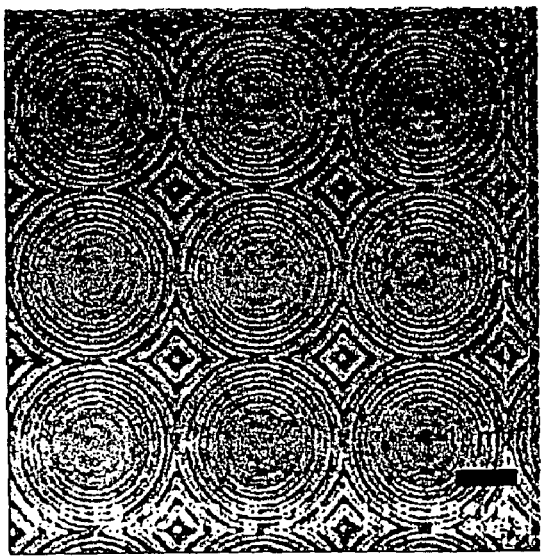
Figure 15D:
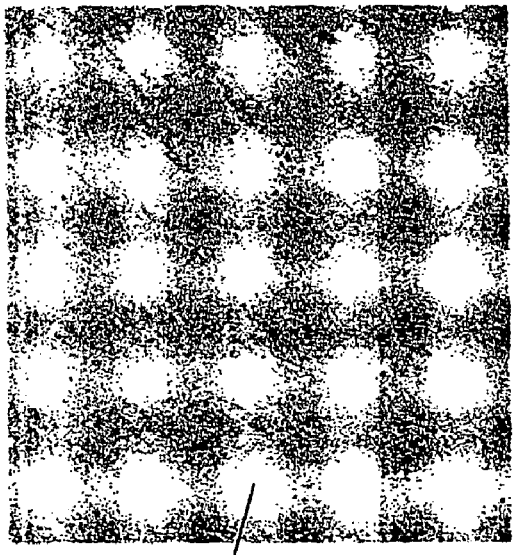

FIGS. 15A to 15D show a comparison between circular incident window areas and square incident window areas. In the case of the circular incident window area (FIG. 15A), spaces are generated between lenses as shown in FIG. 15B. Therefore, leakage light 63 is generated outside the light-collecting spots 62, which causes loss of collecting light. However, in the case where the incident window area is square and a present refractive index distribution is also formed in an area shared with an adjacent lens (FIG. 15C), the incident light can be collected in all pixel areas as shown in FIG. 15D. Therefore, the leakage light is not generated and the loss of collecting light 63 can be reduced.

Figure 16A:
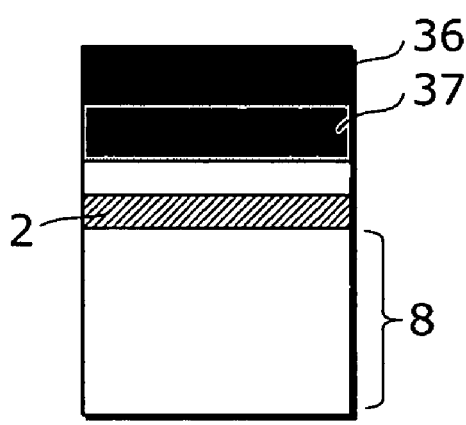
FIGS. 16A to 16D are diagrams showing a process of manufacturing a distributed index lens according to third to fifth embodiments.
Figure 16C:
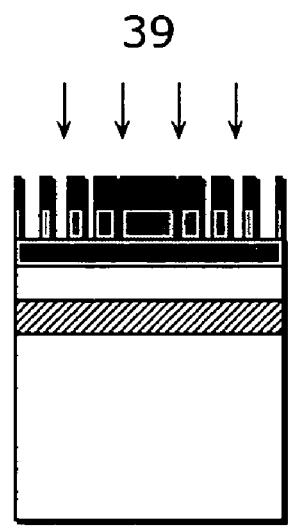
Figure 16B:
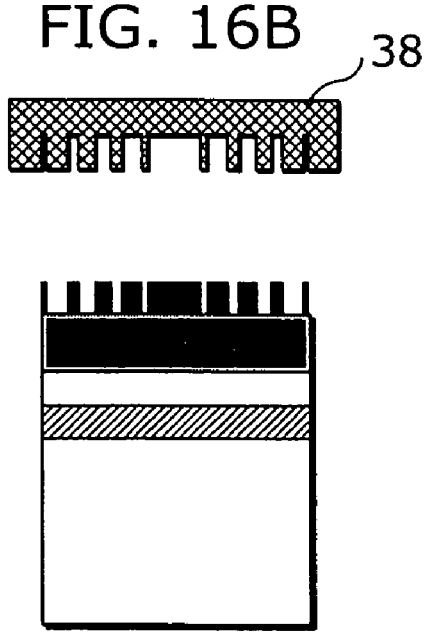
Figure 16D:
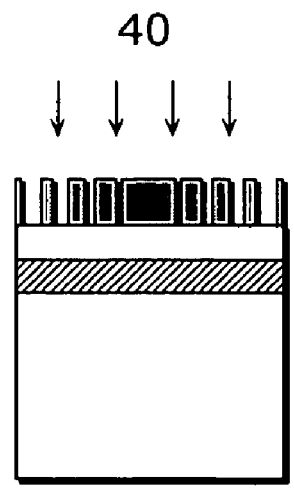

FIGS. 16A to 16D show a manufacturing method of a distributed index lens. The lens formation is performed by nanoimprinting and etching. First, using a general semiconductor process, a semiconductor integrated circuit 8 (not shown in FIG. 9) made up of a light-receiving device, a wiring, a light-blocking layer and a signal transmitting unit, and a color-filter 2 are formed on a Si substrate. The size of one pixel is 2.8 μm square, and the light-receiving device is 1.1 μm square. After that, $TiO_2$ film 37 is formed using plasma CVD method, and resist 36 is coated on the film (FIG. 16A). The thicknesses of the $TiO_2$ film and the resist are respectively 0.5 μm and 0.5 μm. A fine structure is transferred on the resist by heat pressing a SiC mold 38 in which the concentric circle structure is patterned at 150° C. (FIG. 16B). The mold is manufactured by general electron beam lithography and etching. After post-baking at 180° C., the first etching 39 is then performed by Ar ion milling (FIG. 16C). After resist is removed, the concentric circle structure is formed on a pixel by wet etching 40 (FIG. 16D).

The lenses according to embodiments 3 to 5 hereafter explained are formed by the nanoimprinting method, which are distributed index lens using differences of refractive indexes between $TiO_2$ and air.

Third Embodiment

FIGS. 17A to 17C are diagrams, each of which shows a fundamental structure of one pixel according to the third embodiment. The lenses according to the pixel form a refractive index distribution in a single Fresnel zone area as applying a phase modulation of the equation (4) to the incident light. The light 66, 67, and 68 incoming to an incident window with respective incident angle of 0°, α/2° and α° are respectively collected by an incident light distributed index lens 69 for 0°, an incident light distributed index lens 70 for α/2°, and an incident light distributed index lens 71 for α°, pass the color filter 2, and are converted into an electronic signal at the light-receiving device. Here, the angle α is defined by the equation (8). Also, D is a pixel size.

[Equation 14]

$$\alpha = \sin^{-1}\left(\frac{n_1 D}{2n_0 f}\right) \quad (8)$$

The distributed index lens according to the present embodiment can optimize the lens structure of each pixel depending on a wavelength of the incident light so that there is no difference of the light-collection efficiency because of the incident angle, and the light can be collected highly efficiently. While, in the distributed index lens for 0° incident light, a center of the concentric circle structure is the center part of a pixel, the center of the circle shifts toward the light incoming side as the incident angle increases.

As shown in the equations (4) and (1), this is because that the maximum value of a quadratic curve of the refractive index shifts towards the light incoming side as the incident angle θ increases (see FIG. 18).

In the case where the incident angle is a or smaller, the lens can be designed as a single Fresnel zone area while maintaining a certain film thickness (equivalent to one phase). Herein, the light is incident continuously on the lens so that a scattering loss at the surface of the lens is reduced and the light-collection efficiency is increased. In the case where the incident angle is a or greater, the film thickness may be further increased in order to make an optical path longer (greater phase modulation).

Further, as clearly seen from the equations (4) and (5), the phase modulation is different depending on a wavelength of light. This means to have an optimum lens structure depending on a color of light incoming to each pixel. In the present embodiment, in the case where light of respective wavelength of 0.45 μm, 0.55 μm and 0.65 μm is incident on a respective pixel having a lens structure of each color, it is known that each pixel has a high light-collection efficiency of around 80 percent.

Fourth Embodiment

Figure 19:
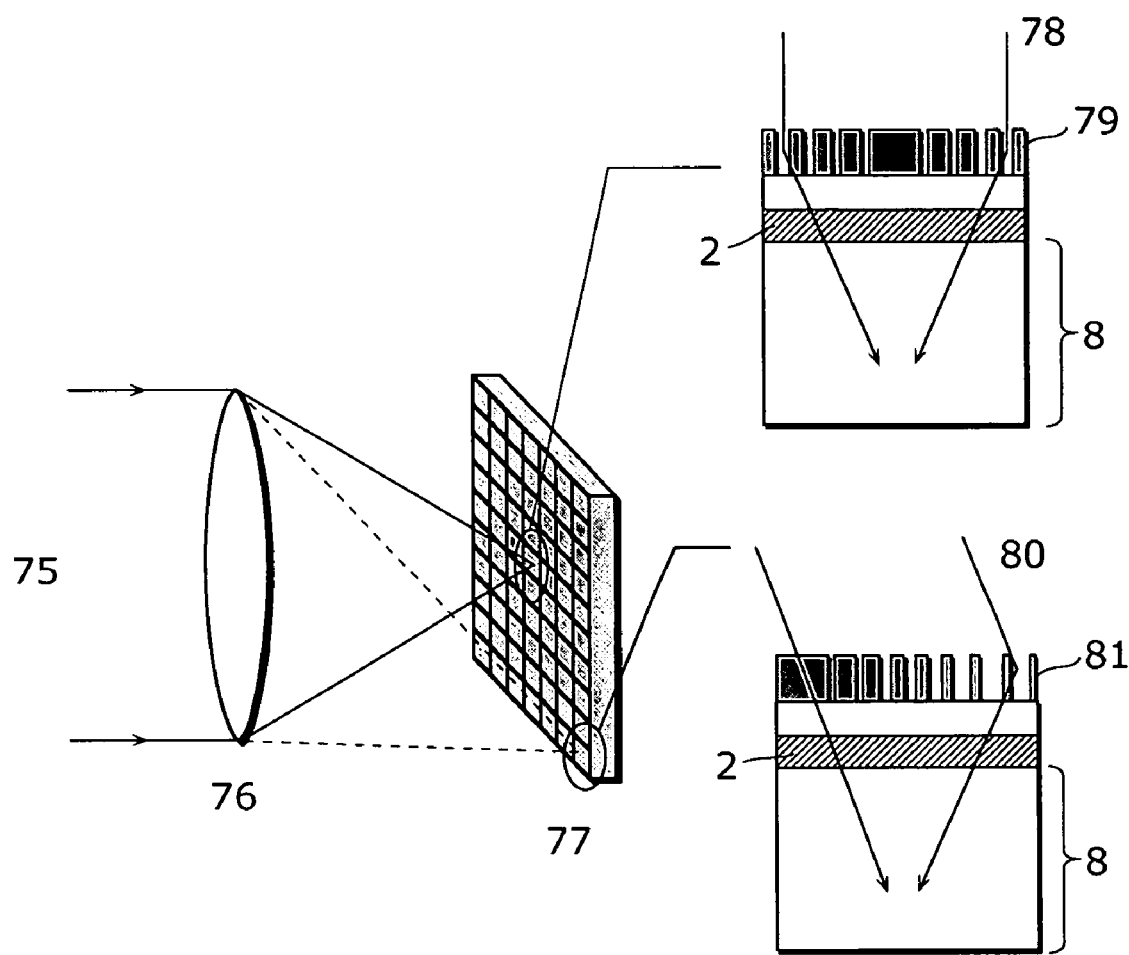
FIG. 19 is a diagram showing a state of pixel arrangements in a solid-state imaging apparatus according to the fourth embodiment.

FIG. 19 is a diagram showing a state of pixel arrangements in a solid-state imaging apparatus using a video graphics array (VGA) (310,000 pixels) according to the fourth embodiment. The signal light 75 is collected at an optical lens 76 and irradiated on a solid-state imaging apparatus 77 having distributed index lenses. In the solid-state imaging apparatus in which a semiconductor integrated circuit 8 including light-receiving devices, wirings and the like and distributed index lens are arranged in a two-dimensional array, the incident angle of light is different for pixels in a center part and for pixels in a peripheral part. While the incident light enters at approximately 0° into the pixels in the center part, the incident light enters at the incident angle of approximately 30° into the pixels in the peripheral part. Accordingly, in the present embodiment, distributed index lenses corresponding to the incident light component with the strongest light intensity that is incident on each pixel are formed from the center part towards the peripheral part of the imaging apparatus. Each distributed index lens optimizes the lens structure depending on the position of a pixel on the imaging apparatus so that the light-collection efficiency becomes the highest. It should be noted that, for the incident light with the incident angle of 20° or less, the light-collection efficiency is increased by shrinking the semiconductor integrated circuit. For the incident light with the incident angle of 20° or greater, the lens structure is optimized while maintaining the maximum shrinking amount (0.438 μm by a shift of the lowest layer Al wiring).

Figure 20:
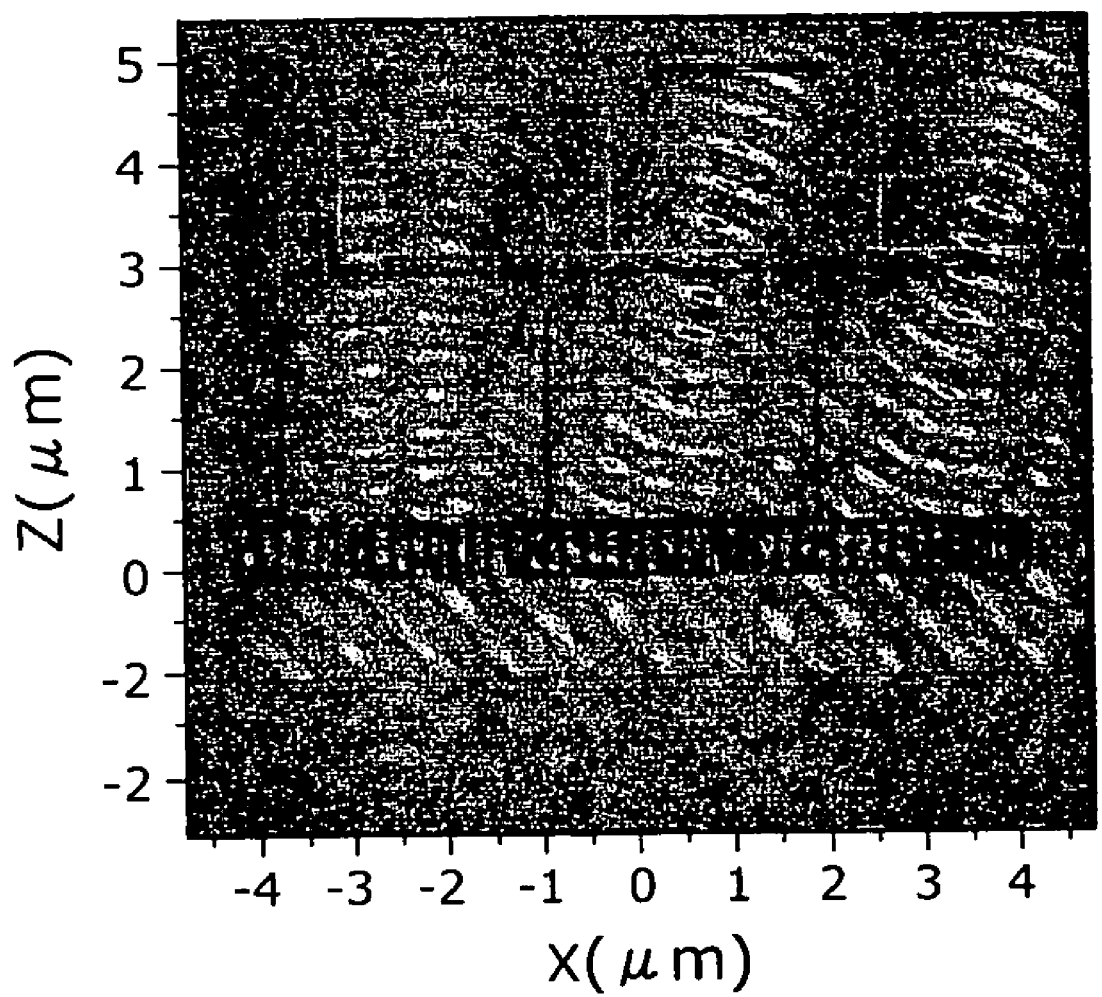
FIG. 20 is a diagram showing a simulation result of a light propagation profile in a pixel according to the fourth embodiment.

FIG. 20 is a diagram showing a simulation result of a light transmission profile in a pixel in which its circuit is shrunk and the lens structure is optimized, for the incident light with the incident angle of 45°. It is recognized from the diagram that the direction of transmitting incident light is curved when the light passes through the lens, the focal point is connected in the first wiring layer (light-blocking layer), and the light is transmitted until the light-receiving device. It indicates that an outgoing angle and focal length of light can be controlled by changing the lens structure in accordance with the equations (4) and (1).

Figure 21B:
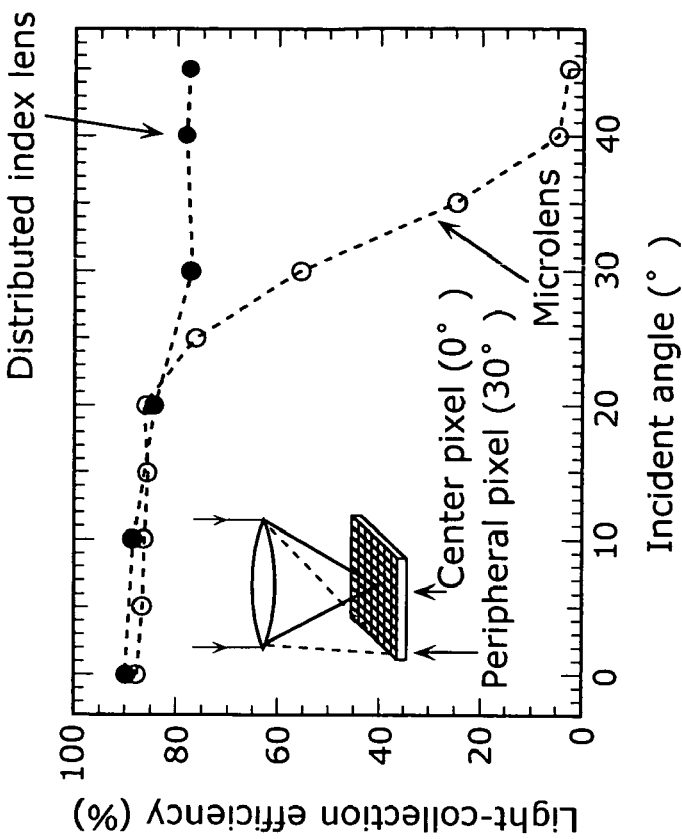
FIGS. 21A and 21B are diagrams, each of which shows light-collection efficiency of the solid-state imaging apparatus according to the fourth embodiment.
Figure 21A:
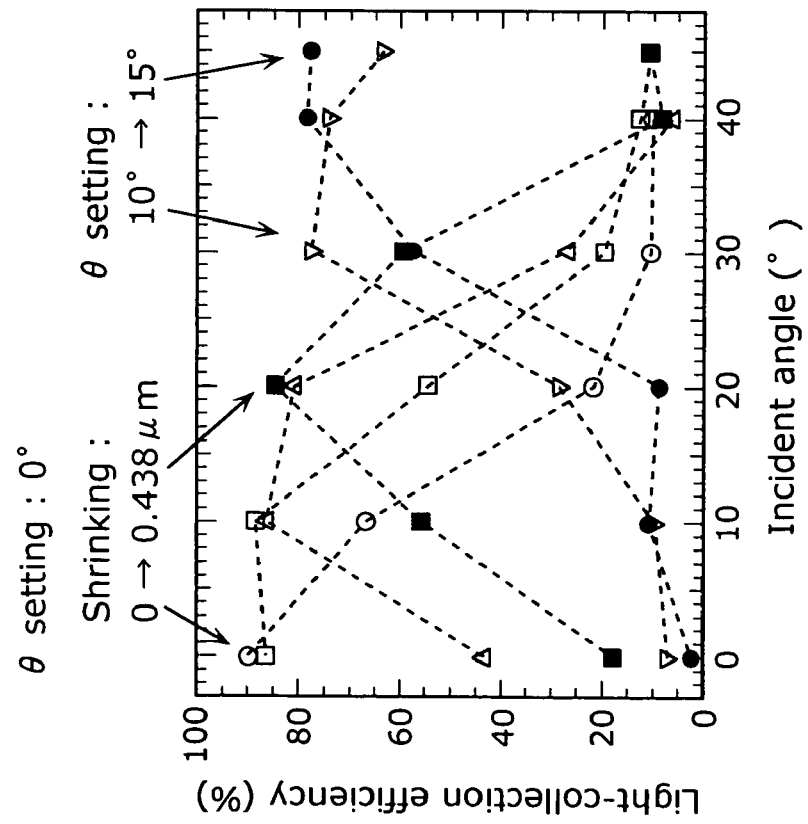

FIG. 21A is a diagram showing dependency on incident angle of the light-collection efficiency. For the lens at which the incident angle θ is set to 0° and of which the circuit is not shrunk, the light-collection efficiency decreases flatly as the incident angle increases. As the amount of shrinking increases, a peak of the light-collection efficiency is shifted towards higher angles and the peak of the efficiency reaches 20° when the maximum amount of shrinking is 0.438 μm. When the lens structure is optimized while maintaining the maximum amount of shrinking, the peak is further shifted to a higher angle and the peak of the maximum efficiency reaches 45° for the lens at which θ is set to 15°.

FIG. 21B is a diagram showing when the result is plotted as a characteristic of the solid-state imaging apparatus as a whole. The angle of the horizontal axis indicates an angle of light incidents on the solid-state imaging apparatus, and 0° indicate the center part while 30° or higher indicate peripheral pixels. While the light-collection efficiency of the solid-state imaging apparatus using a microlens rapidly declines from the pixels around the incident angle of 20°, the light-collection efficiency is maintained at 80 percent even in the peripheral pixels in a distributed index lens of the present invention. As clearly seen from FIG. 21B, compared to the microlens, the distributed index lens of the present invention has a weaker dependency on the angle of the incident light. Accordingly, the decline of light-collection efficiency along with the increase of the incident angle can be moderated by combining the shrink structure with the lens of the present invention.

Therefore, its application for a short focal point system such as a camera for a cell phone can be expected.

Fifth Embodiment

FIGS. 22A to 22C are diagrams, each of which shows a fundamental structure of one pixel according to the fifth embodiment. The lenses in the current pixel form a refractive index distribution of plural Fresnel zone areas as applying a phase modulation of the equation (5) to the incident light. The light 86, 87, and 88 incoming to an incident window at respective incident angle of 0°, α° and 2α° are respectively collected by an incident light distributed index lens 89 for 0°, an incident light distributed index lens 90 for α°, and an incident light distributed index lens 91 for 2α°, pass the color filter 2, and are converted into an electronic signal at the light-receiving device.

Figure 23C:
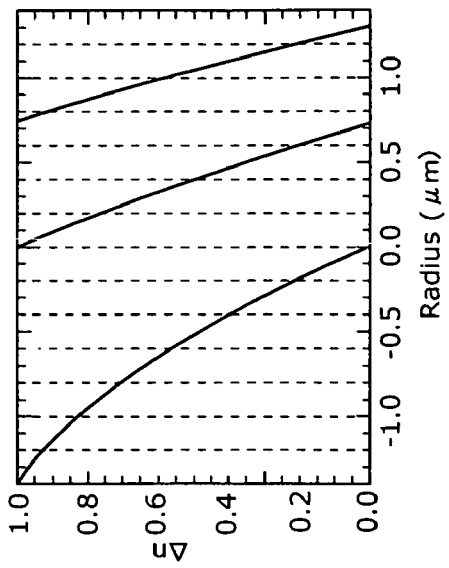
FIGS. 23A to 23C are diagrams, each of which shows a refractive index distribution of a lens according to the fifth embodiment.
Figure 23B:
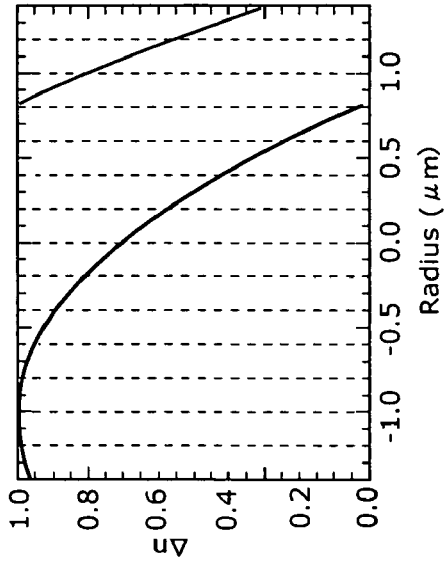
Figure 23A:
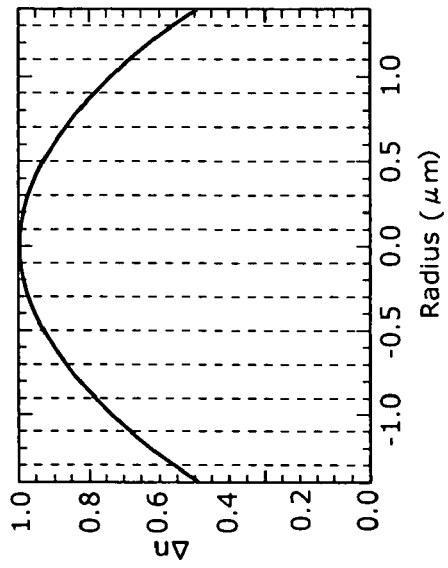

Similar to the lens according to the fourth embodiment, also in the distributed index lens according to the present embodiment, the maximum value of the refractive index distribution in the first Fresnel zone area is shifted to the incoming side as the incident angle increases (FIGS. 23A to 23C). When the angle is made higher, the second and third Fresnel zone areas are appeared. Even for the light incoming at a high angle of 45° or higher, a high light-collection efficiency can be maintained by using the plural Fresnel zone areas. In principle, the light-collection efficiency is 100 percent when the film thickness is equivalent to one phase. However, the efficiency is decreased when the film thickness does not satisfy the equation (7) or a periodic structure of each Fresnel zone area arrangement does not satisfy the equation (5).

Figure 24:
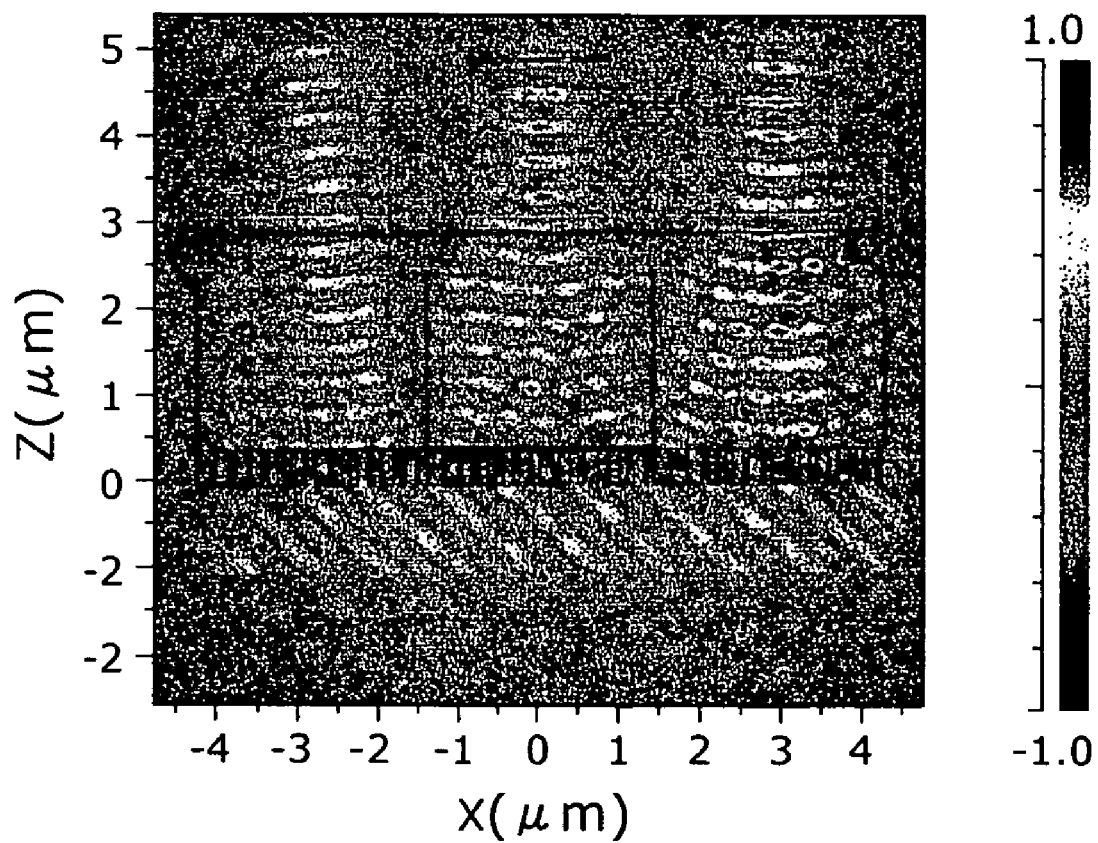
FIG. 24 is a diagram showing a simulation result of a light propagation profile in a pixel according to the fifth embodiment.

FIG. 24 is a diagram showing a simulation result of a light transmission profile in a pixel whose lens structure is optimized, for the incident light with the incident angle of 45°. It should be noted that the circuit is not shrunk. It can be recognized from the diagram that the incident light is collimated towards a direction of the light-receiving device, passes through the first wiring layer (light-blocking layer), and is transmitted to the light-receiving device.

Figure 25A:
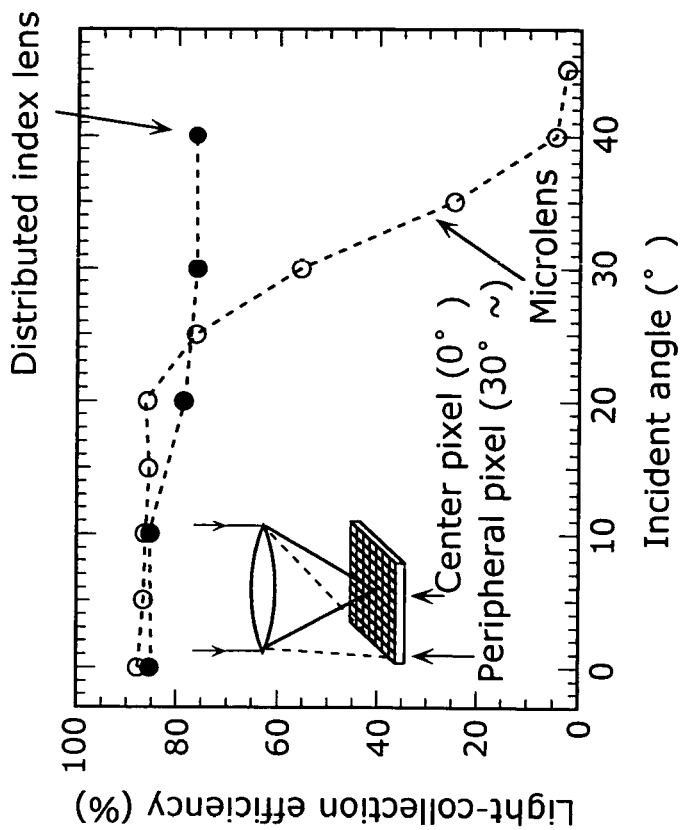
FIGS. 25A and 25B are diagrams showing light-collection efficiency of a solid-state imaging apparatus according to the fifth embodiment.

FIG. 25A is a diagram showing a dependency on an incident angle of the light-collection efficiency. When the setting of the incident angle θ is increased from 0 degree, the peak of the light-collection efficiency is shifted toward a high angle side so that the θ setting is 40° and the peak position of the light-collection efficiency is 40°.

Figure 25B:
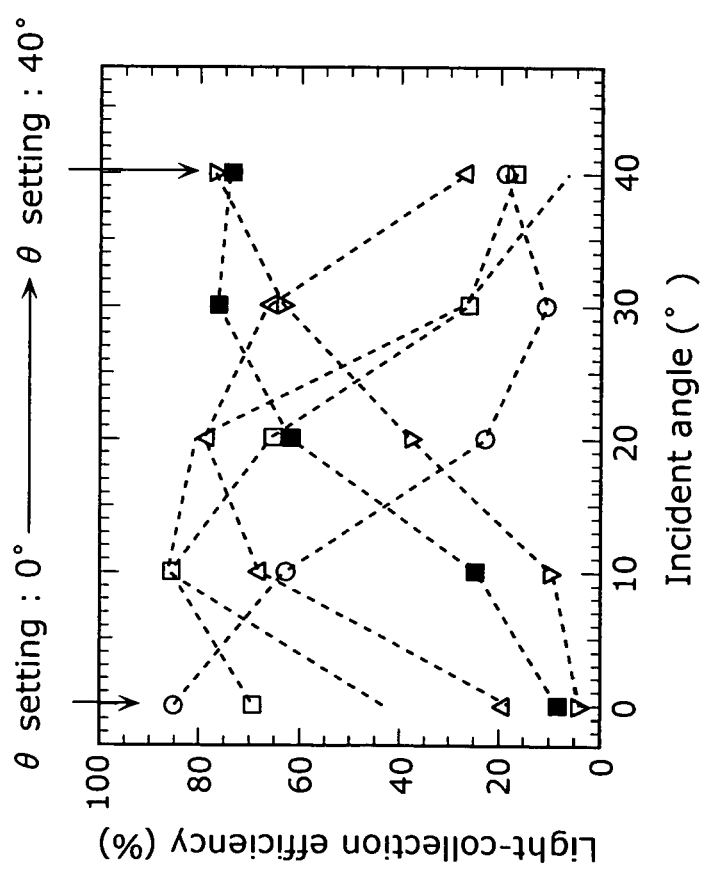

FIG. 25B is a diagram showing dependency on a pixel position of the light-collection efficiency. The increase of the incident angle indicates that a position of a pixel is in a direction of an edge of the imaging apparatus. In comparison, data of the solid-state imaging apparatus having the microlens structure is also described on the side. It should be noted that, in this structure, the semiconductor integrated circuit is not shrunk. As clearly seen from FIG. 25B, in the solid-state imaging apparatus including lenses having plural Fresnel zone areas, the light-collection efficiency more than that of the microlens is obtained in a high angle area of the incident angle of 20° or higher in spite of the fact that shrinking is not performed. The result indicates that a high sensitive imaging apparatus whose light-collection efficiency does not depend on the pixel positions without being shrunk can be manufactured.

Sixth Embodiment

Figure 26:
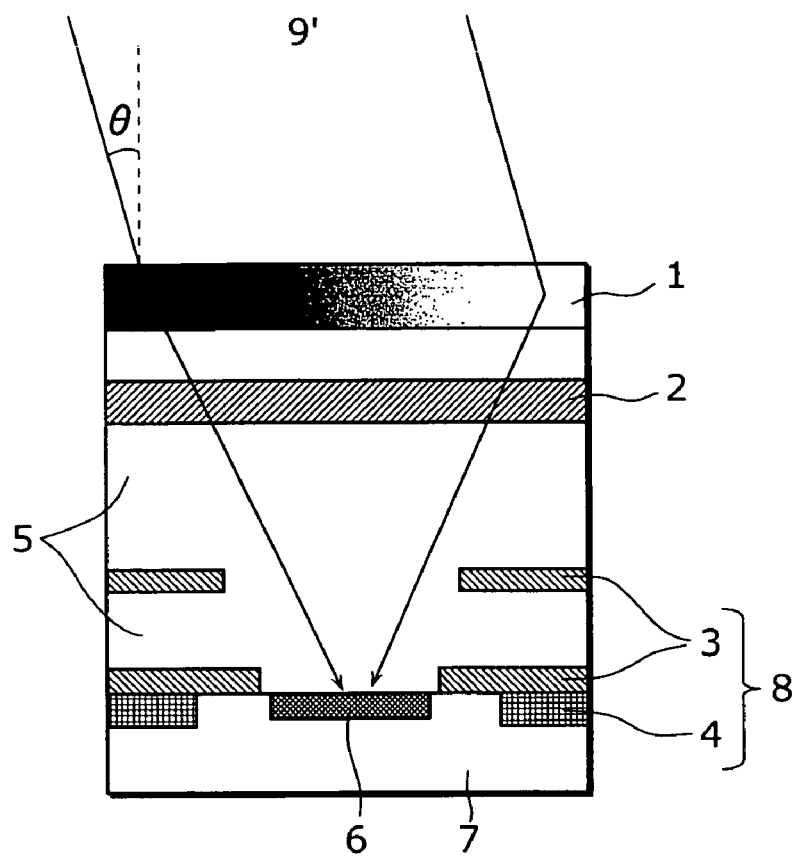
FIG. 26 is a diagram showing a fundamental structure of one pixel according to the sixth embodiment.

FIG. 26 is a diagram showing a fundamental structure of a SVGA (480,000 pixels) compliant solid-sate imaging apparatus according to a sixth embodiment. Each pixel (2.8 μm square in size) is made up of a distributed index lens 1, a color filter 2 for green (G), Al wirings 3, a signal transmitting unit 4, planarizing layers 5, a light-receiving device (Si photodiode) 6, and a Si substrate 7.

Figure 27:
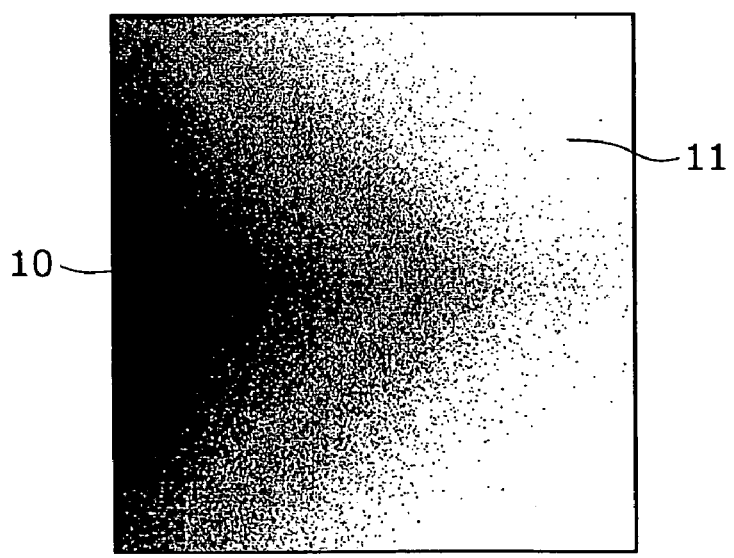
FIG. 27 is a diagram showing a structure of a top surface of a distributed index lens according to the sixth embodiment.

FIG. 27 is a diagram showing a top view of the distributed index lens. The refractive indexes continuously change, in an in-plane direction, from a high refractive index area 10 [$GeO_2$ (n=1.65)] to a low refractive index area 11 [$SiO_2$ (n=1.45)]. Thus, the refractive indexes are continuously distributed so that a scattering loss on the lens surface is avoided and the light-collection efficiency is greatly improved. The refractive index distribution according to the present embodiment is defined as a single Fresnel zone area in accordance with the equation (4). Also, the film thickness is 1 μm.

Figure 28A:
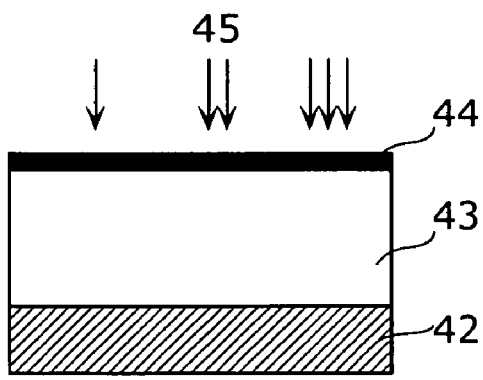
FIGS. 28A to 28E are diagrams showing a process of manufacturing the distributed index lens according to the sixth embodiment.
Figure 28B:
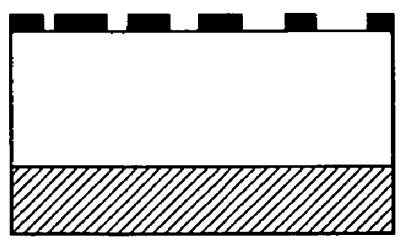
Figure 28C:
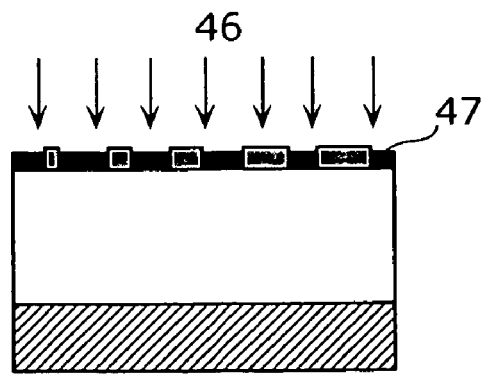
Figure 28D:
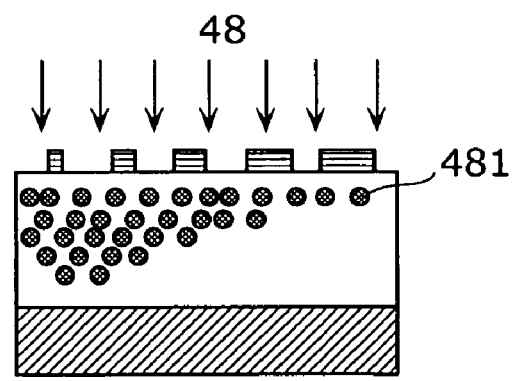
Figure 28E:
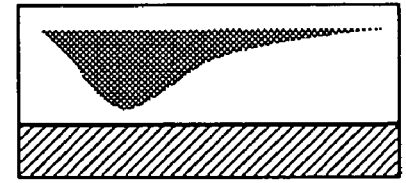

FIGS. 28A to 28E are diagrams showing a process of manufacturing the distributed index lens according to the present embodiment. The lens formation is performed by ion implantation. First, a semiconductor integrated circuit 42 (not shown in FIG. 28) made up of a wiring, a light-blocking layer and a signal transmitting unit is formed on a Si substrate using a general semiconductor process. Here, the size of one pixel is 2.8 μm square and the size of the light-receiving device is 1.1 μm square. After that, $SiO_2$ film 43 is formed and a resist 44 is coated thereon, using a spattering apparatus. Then, patterning is performed by an electron beam exposure 45 (FIG. 28A). The thicknesses of the $SiO_2$ film and resist are respectively 0.5 μm and 0.5 μm. After developing (FIG. 28B), electron beam evaporation 46 of metal (Au is used for this case) is performed (FIG. 28C). After removing the resist, Ge Ion is implanted with accelerating voltage of 180 keV (FIG. 28D). After removing the resist, a lens that is continuously distributed according to the refractive indexes can be formed on a pixel (FIG. 28E).

Seventh Embodiment

Figure 29:
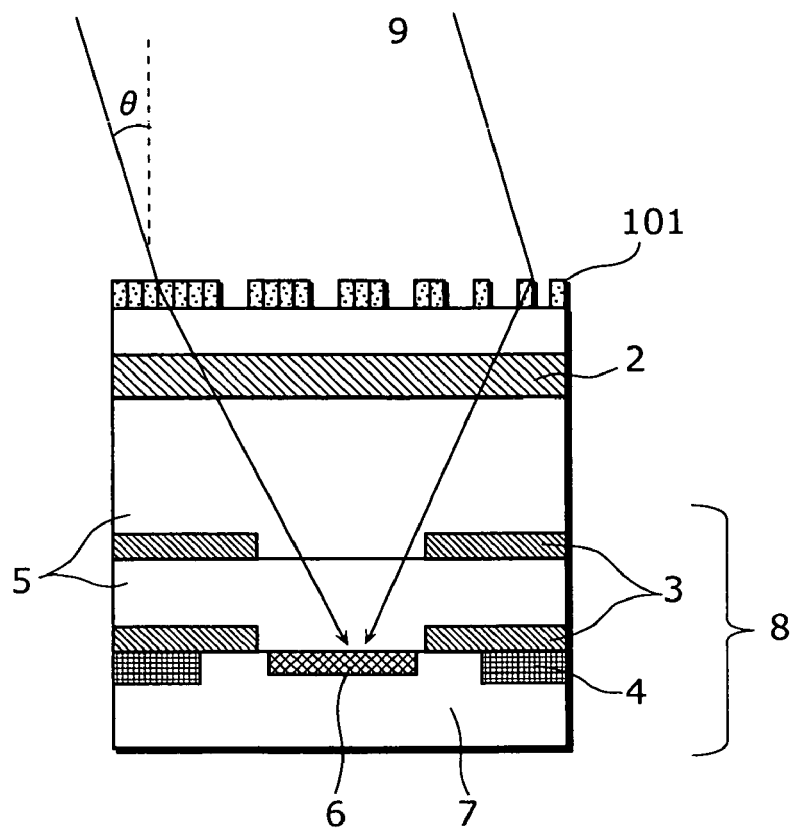
FIG. 29 is a diagram showing a fundamental structure of one pixel according to the seventh embodiment.

FIG. 29 is a diagram showing a fundamental structure of a VGA (310.000 pixels) compliant solid-state imaging apparatus according to a seventh embodiment. Each pixel (2.8 μm square in size) is made up of a distributed index lens 1, a color filter 2 for green (G), Al wirings 3, a signal transmitting unit 4, planarizing layers 5, a light-receiving device (Si photodiodes) 6, and a Si substrate 7.

Figure 30:
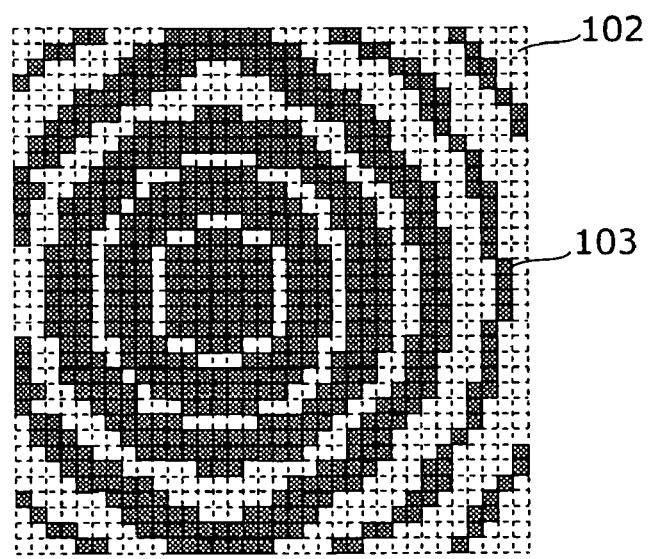
FIG. 30 is a diagram showing a structure of a top surface of the distributed index lens according to the seventh embodiment.

FIG. 30 is a diagram showing a top view of a distributed index lens according to the present embodiment. The present lens structure is a structure in which light-transmitting materials having a diameter equal to or smaller than a wavelength of the incident light are unevenly scattered in or on the light-transmitting films whose refractive indexes are different from each other. Herein, an effective refractive index sensed by light can be calculated by a volume ratio between the high refractive index material 103 and the low refractive index material 102 in a divided area. The best characteristic of this structure is that a distributed index device can be easily formed by changing the effective refractive indexes by changing spaces between adjacent high refractive index materials. In the present embodiment, the high refractive index materials 103 [$TiO_2$ (n=2.53)], one side of each is 0.2 μm or less, are dispersed in the low refractive index 102 [$SiO_2$ (n=1.45)].

Figure 31A:
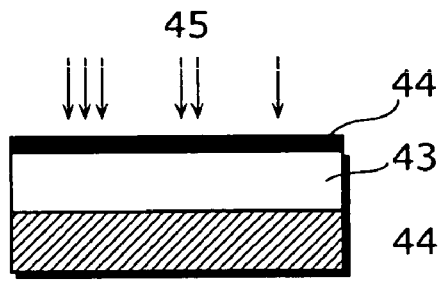
FIGS. 31A to 31E are diagrams showing a process of manufacturing the distributed index lens according to the seventh embodiment.
Figure 31B:
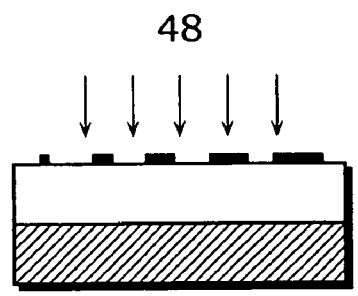
Figure 31C:
Figure 31D:
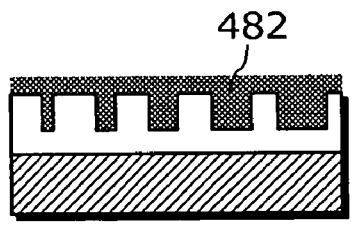
Figure 31E:
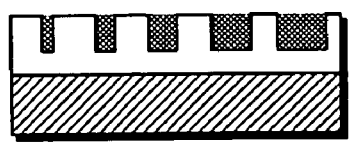

FIGS. 31A to 31D are diagrams showing a process of manufacturing the distributed index lens according to the present embodiment. A lens formation is performed by electron beam lithography and etching. First, a semiconductor integrated circuit 42 (not shown in FIG. 31) made up of a wiring, a light-blocking layer and a signal transmitting unit is formed on a Si substrate using a general semiconductor process. Here, the size of one pixel is 2.8 μm square and the size of the light receiving device is 1.1 μm square. After that, $SiO_2$ film 43 is formed and resist 44 is coated thereon, using a spattering apparatus. Then, pattering is performed by an electron beam exposure 45 (FIG. 31A). The thicknesses of the $SiO_2$ film and resist are respectively 0.5 μm and 0.5 μm. After developing, a fine structure is formed on a pixel surface by etching (FIG. 31B). It should be noted that the lens according to the second embodiment a lens whose manufacturing process is completed when the resist is exposed to light and developed. After removing the resist, $TiO_2$ is deposited using Plasma CVD (FIG. 31C). After removing the $TiO_2$ layer covered the whole pixel areas by polishing the surface, it is post baked at 800° C. (FIG. 31D). The distributed index lens made of light refractive index materials unevenly dispersed on the pixel can be formed through the aforementioned process.

While in the first to seventh embodiments, a phase modulation given by the equations (4) and (6) are realized by refractive index distribution of the light-transmitting films in an in-plane direction, it can surely be realized by film thickness distribution in a normal line direction.

Eighth Embodiment

Figure 32:
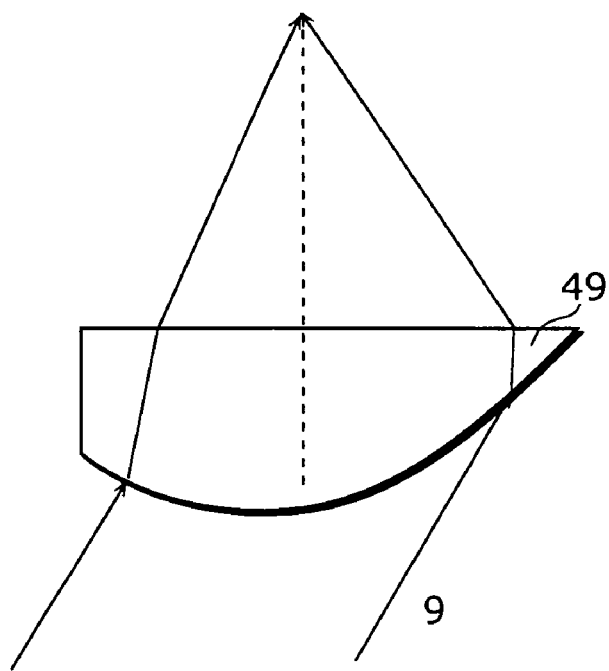
FIG. 32 is a diagram showing a cross-section of a structure of a thickness distribution lens according to an eighth embodiment.

FIG. 32 is a diagram showing a cross-section of a thickness distribution lens obtained by the equations (4) and (6). Since the phase modulation is a single Fresnel zone area, light is continuously incident on the lens, the scattering loss on the surface is very small so that the light-collection efficiency is improved. In order to manufacture a lens resistant to a higher angle incidence, a film thickness on the light incoming side can be increased in accordance with the equations (4) and (6).

Ninth Embodiment

Figure 33:
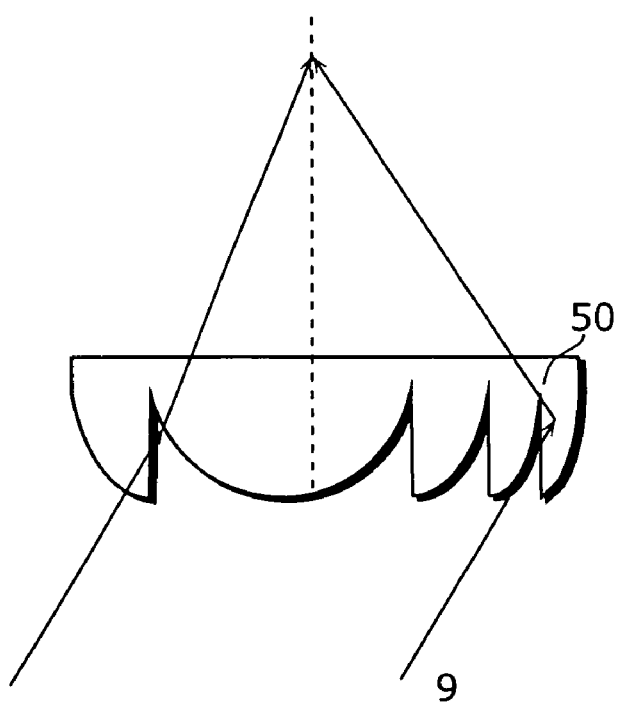
FIG. 33 is a diagram showing a cross-section of a structure of a thickness distribution lens according to a ninth embodiment.

FIG. 33 is a diagram showing a cross-section of a thickness distribution lens obtained by the equations (5) and (6) according to the ninth embodiment. Since the phase modulation is plural Fresnel zone areas, the thickness distribution lens is applicable to higher angle incident light than the lens of the single Fresnel zone area. Further, the film thicknesses for one phase of the incident light are the same so that it is easily equipped to the solid-state imaging apparatus.

For the thickness distribution lens, in the case where the size of the lens is large, it can be manufactured by machine polishing and the like. However, in the case where the lens is a microlens whose diameter is few tens μm or less, it is very difficult to control the spherical shape because the structure is very fine structure and self-organizationally formed by reflow processing. Therefore, in order to manufacture a fine thickness distribution lens, it is necessary to make the surface discontinuous rather than continuous.

Tenth Embodiment

Figure 34:
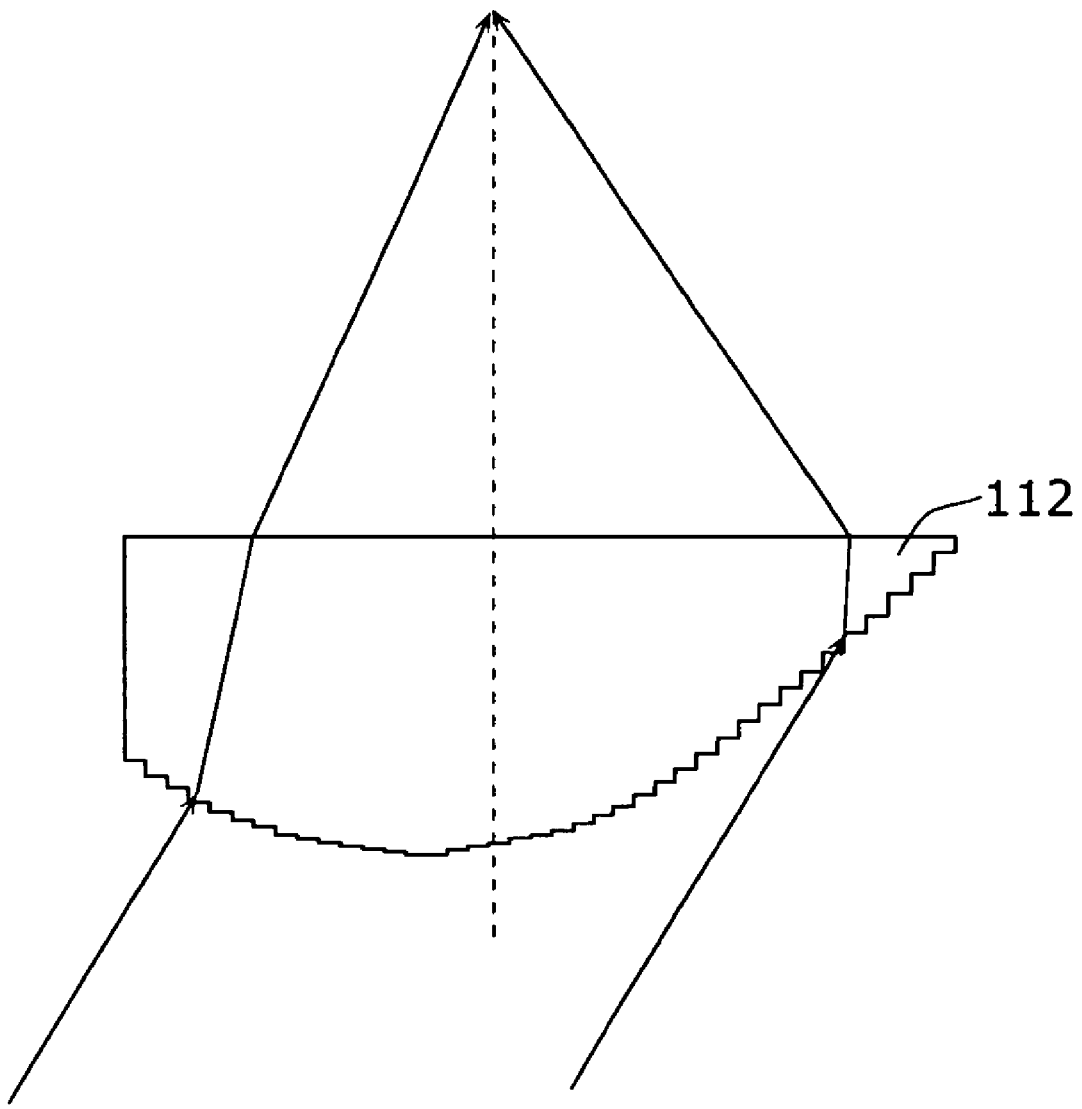
FIG. 34 is a diagram showing a cross-section of a structure of a thickness distribution lens according to a tenth embodiment.

FIG. 34 is a diagram showing a thickness distribution lens whose film thickness is changed discretely and unevenly in an in-layer direction of light-transmitting films. The discontinuous thickness distribution rarely affects the light-collection efficiency by forming the lens surface to have a step structure having steps, each of which is as long as or smaller than the wavelength of light to be entered. The light-collection efficiency of thickness distribution lens (diameter 3 μm) of the present embodiment whose step is 0.1 μm is 80 percent that is very high. A microlens can be easily manufactured using a nanoimprinting technology described in the first to fifth embodiments and an electron beam lithography technology described in the seventh embodiment.

Eleventh Embodiment

Figure 35:
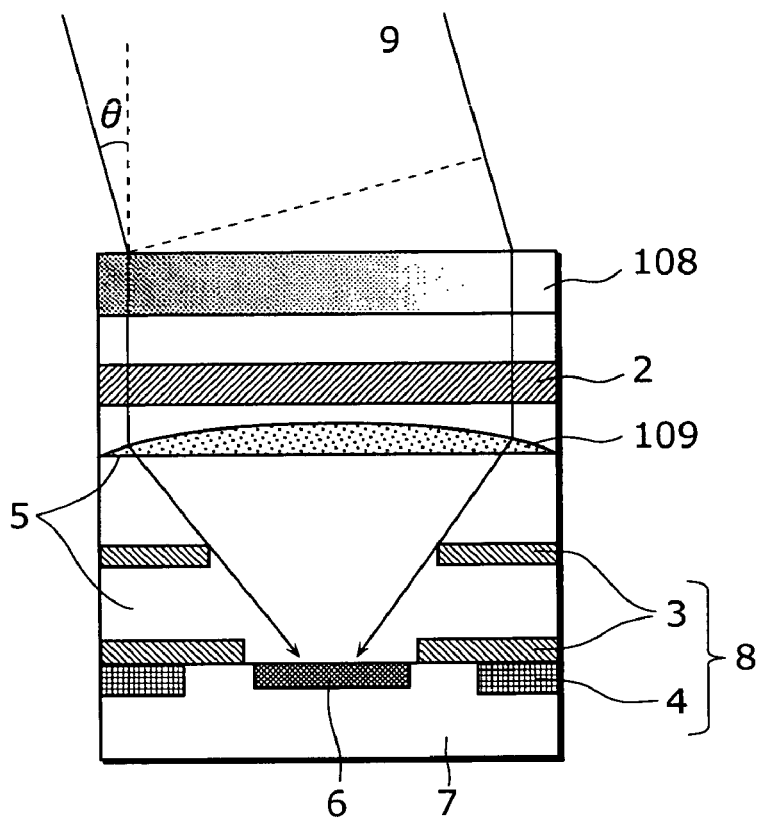
FIG. 35 is a diagram showing a fundamental structure of one pixel according to an eleventh embodiment.

FIG. 35 is a diagram showing a solid-state imaging apparatus only using a deviation component of the light-transmitting films according to the present invention. Each pixel (2.8 μm square in size) is made up of a distributed index lens 108, a color filter 2 for green (G), Al wirings 3, a signal transmitting unit 4, planarizing layers 5, a light-receiving device (Si photodiodes) 6, a Si substrate 7, and an in-layer lens 109.

Figure 36A:
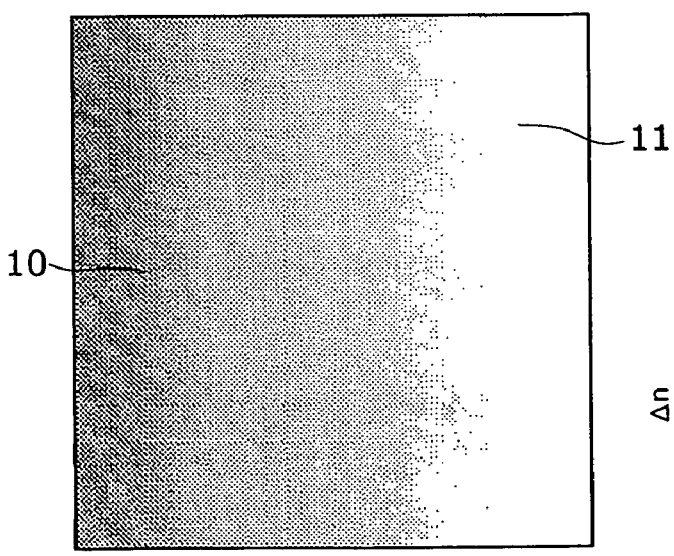
FIGS. 36A and 36B are diagrams showing a structure of a top surface of a lens and a refractive index distribution according to the eleventh embodiment.
Figure 36B:
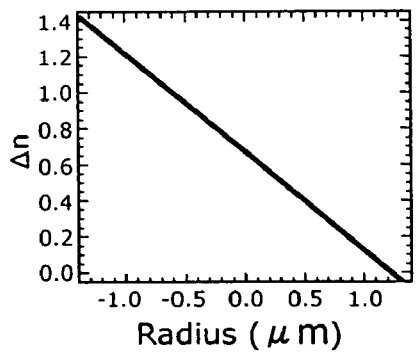

FIG. 36A is a diagram showing a top view of the distributed index lens. The refractive indexes continuously change, in an in-layer direction, from a high refractive index area 10 to a low refractive index area 11 ($SiO_2$ (n=1.45)). The refractive index distribution according to the present embodiment is designed to give a phase modulation shown in the equation (2). The component of the equation (2) is a linear function so that the changes of the refractive indexes become linear and the refractive index on the light incoming side is higher. While the single Fresnel zone area is used in the present embodiment, plural Fresnel zone areas can of course be used. Also, similar phase modulation can be realized by a thickness distribution.

It should be note that, while a CCD is used in the first, third to seven, and eleventh embodiments, a MOS sensor may be of course used. Further, a distributed index lens and a thickness distribution lens made of other materials and having same characteristic as the distributed index lens and the thickness distribution lens that are explained in the above. Furthermore, the distributed index lens and the thickness distribution lens may be manufactured using other manufacturing methods that are not explained here.

INDUSTRIAL APPLICABILITY

A light-collecting device and a solid-state imaging apparatus according to the present invention are applicable to a digital video camera, a digital still camera, a camera-equipped cell phone and the like. Also, it is industrially useful because high performance and low price can be realized.

The invention claimed is:
1. A solid-state imaging apparatus comprising arranged unit pixels, each of which includes a light-collector and a light-receiver,
   wherein said light-collector comprises:
   a substrate into which incident light is incident; and
   above said substrate, a plurality of light-transmitting films are formed in a region into which the incident light is incident,
   wherein each light-transmitting film of said plurality of light-transmitting films forms a zone having a width which is equal to or shorter than a wavelength of the incident light,
   wherein each zone shares a center point which is located at a position displaced from a center of said light-receiver, and
   said plurality of light-transmitting films form an effective refractive index distribution represented by a quadratic curve expressed by a distance from a center of a corresponding one of the unit pixels,
   wherein, in a unit pixel, among said unit pixels, which is located at a center of a plane on which said unit pixels are formed, a position at which an effective refractive index distribution of a corresponding light-collector repre- sented by the quadratic curve reaches a maximum value matches a central axis of a corresponding light-receiver, and wherein in a unit pixel, among said unit pixels, which is located at a periphery of the plane, a position at which the effective refractive index distribution of a corresponding light-collector represented by the quadratic curve reaches a maximum value is displaced from the central axis of a corresponding light-receiver toward the center of the plane.

2. The solid-state imaging apparatus according to claim 1, wherein incident light is collected in a center of a plane made of said plurality of light-transmitting films, the incident light being incident at an angle asymmetrical to the center of the plane made of said plurality of light-transmitting films.

3. The solid-state imaging apparatus according to claim 1, wherein an amount of phase change of the incident light, $\phi(x)$, depends on a distance x in an in-plane direction and approximately satisfies the following equation, $$\phi(x)=Ax^2+Bx\sin\theta+2m\pi$$

wherein $\theta$ is an incident angle of the incident light, A and B are predetermined constants, and m is a natural number.

4. The solid-state imaging apparatus according to claim 1, wherein $$\Delta n(x)=\Delta n_{max}[\phi(x)/2\pi+C]$$

is satisfied, where $\Delta n_{max}$ is a difference of refractive indices between one of said plurality of light-transmitting films and a light-incoming side medium, $\Delta n(x)$ is a difference of refractive indices between another one of said plurality of light-transmitting films and the light-incoming side medium at a position x, and C is a constant.

5. The solid-state imaging apparatus according to claim 1, wherein heights of said plurality of light-transmitting films are constant in a direction normal to said plurality of light-transmitting films.

6. The solid-state imaging apparatus according to claim 1, wherein each of said plurality of light-transmitting films includes one of $TiO_2$, $ZrO_2$, $Nb_2O_5$, $Ta_2O_5$, $Si_3N_4$ and $Si_2N_3$.

7. The solid-state imaging apparatus according to claim 1, wherein each of said plurality of light-transmitting films includes one of $SiO_2$ doped with B or P, that is Boro-Phospho Silicated Glass, and Teraethoxy Silane.

8. The solid-state imaging apparatus according to claim 1, wherein each of said plurality of light-transmitting films includes one of benzocyclobutene, polymethymethacrylate, polyamide and polyimide.

9. The solid-state imaging apparatus according to claim 1, wherein an off-centered light-transmitting film is formed in an area shared by one light-collector and another light-collector in an adjacent unit pixel.

10. The solid-state imaging apparatus according to claim 1, comprising:
a first unit pixel for a first color light of the incident light; and
a second unit pixel for a second color light which has a typical wavelength that is different from a wavelength of the first color light;
wherein said first unit pixel includes a first light-collector, and
said second unit pixel includes a second light-collector, in which a focal length of the second color light is equal to a focal length of the first color light in said first light-collector.

11. The solid-state imaging apparatus according to claim 1, wherein a focal point is set at a predetermined position by controlling the effective refractive index distribution of said plurality of light-transmitting films.

12. The solid-state imaging apparatus according to claim 1, wherein each of said unit pixels further includes a light-collecting lens on a light-outgoing side of said light-collector.

13. The solid-state imaging apparatus according to claim 1, wherein the effective refractive index distribution of said plurality of light-transmitting films is different between light-collectors of said unit pixels located at the center of said plane on which said unit pixels are formed and light-collectors of said unit pixels located at the periphery of the plane.

14. The solid-state imaging apparatus according to claim 1, wherein each of said plurality of light-transmitting films of one of said unit pixels located near the center of an imaging area has a line width different from a line width of each of said light-transmitting films of one of said unit pixels located at the periphery of the imaging area and is located at a same relative position in said light-collector as a position of each of said light-transmitting films of the one of said unit pixels located near the center of the imaging area, the imaging area being a plane area on which said unit pixels are formed, and
a sum of line widths of said plurality of light-transmitting films of the one of said unit pixels located near the center of the imaging area differs from a sum of line widths of said plurality of light-transmitting films of the one of said unit pixels located at the periphery of the imaging area.

15. The solid-state imaging apparatus according to claim 14,
wherein each of said plurality of light-transmitting films of the one of said unit pixels located at the periphery of the imaging area has a line width shorter than a line width of each of said light-transmitting films of the one of said unit pixels located near the center of the imaging area and is located at a same relative position in said light-collector as a position of each of said light-transmitting films of the one of said unit pixels located at the periphery of the imaging area.

16. The solid-state imaging apparatus according to claim 1, wherein each of said plurality of light-transmitting films of one of said unit pixels located at the periphery of an imaging area has a line width shorter than a line width of each of said light-transmitting films of one of said unit pixels located near the center of the imaging area and is located at a same relative position in said light-collector as a position of each of said light-transmitting films of the one of said unit pixels located at the periphery of the imaging area, the imaging area being a plane area on which said unit pixels are formed.

17. The solid-state imaging apparatus according to claim 1, wherein said light-collector comprises a concentric ring structure including a plurality of divided areas, each formed of a pair of a high refractive index material zone and a low refractive index material zone, and
wherein in each of said unit pixels,
a predetermined divided area of the plurality of divided areas has a width that is a same as a width of a concentrically outer divided area, and
a width of the high refractive index material zone of the predetermined divided area is wider than a width of the high refractive index material zone of the concentrically outer divided area.

18. A solid-state imaging apparatus comprising arranged unit pixels, each of which includes a light-collector and a light-receiver, wherein said light-collector comprises:

a substrate into which incident light is incident; and above said substrate, a plurality of light-transmitting films are formed in a region into which the incident light is incident, wherein each light-transmitting film of said plurality of light-transmitting films forms a zone having a width which is equal to or shorter than a wavelength of the incident light, wherein each zone shares a center point which is located at a position displaced from a center of said light-receiver, and said plurality of light-transmitting films form an effective refractive index distribution, wherein, in a unit pixel, among said unit pixels, which is located at a center of a plane on which said unit pixels are formed, a position at which an effective refractive index distribution of a corresponding light-collector reaches a maximum value matches a central axis of a corresponding light-receiver, wherein in a unit pixel, among said unit pixels, which is located at a periphery of the plane, a position at which the effective refractive distribution of a corresponding light-collector reaches a maximum value is displaced from the central axis of a corresponding light-receiver toward the center of the plane, wherein said light-collector comprises a concentric ring structure including a plurality of divided areas, each formed of a pair of a high refractive index material zone and a low refractive index material zone, and wherein in each of said unit pixels, a predetermined divided area of the plurality of divided areas has a width that is a same as a width of a concentrically outer divided area, and a width of the high refractive index material zone of the predetermined divided area is wider than a width of the high refractive index material zone of the concentrically outer divided area.

* * * * *